United States Patent
Song et al.

(10) Patent No.: US 10,720,606 B2
(45) Date of Patent: Jul. 21, 2020

(54) DISPLAY DEVICE HAVING PIXEL INCLUDING A FIRST REGION IN WHICH A PIXEL CIRCUIT IS DISPOSED

(71) Applicant: Samsung Display Co., Ltd., Yongin-si, Gyeonggi-do (KR)

(72) Inventors: Hee Rim Song, Yongin-si (KR); Gyung Soon Park, Yongin-si (KR); Il Gon Kim, Yongin-si (KR); Jeong Woo Moon, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/853,065

(22) Filed: Dec. 22, 2017

(65) Prior Publication Data

US 2018/0183008 A1 Jun. 28, 2018

(30) Foreign Application Priority Data

Dec. 26, 2016 (KR) .................. 10-2016-0179431

(51) Int. Cl.
*H01L 51/52* (2006.01)
*H01L 27/32* (2006.01)
(Continued)

(52) U.S. Cl.
CPC ....... *H01L 51/5271* (2013.01); *G09G 3/3225* (2013.01); *G09G 3/3233* (2013.01); *H01L 27/124* (2013.01); *H01L 27/1255* (2013.01); *H01L 27/326* (2013.01); *H01L 27/3216* (2013.01); *H01L 27/3218* (2013.01); *H01L 27/3246* (2013.01); *H01L 27/3258* (2013.01); *H01L 27/3262* (2013.01); *H01L 51/5206* (2013.01); *H01L 51/5253* (2013.01); *H01L 51/5284* (2013.01); *G09G 3/3258* (2013.01); *G09G 2300/0426* (2013.01);
(Continued)

(58) Field of Classification Search
CPC ............. H01L 27/3216; H01L 27/3218; H01L 51/5206; H01L 51/5209
USPC .......................................... 257/40, 59, 79, 98
See application file for complete search history.

(56) References Cited

U.S. PATENT DOCUMENTS 8,879,139 B2  11/2014  Fish, Jr. et al.
2006/0097628 A1*  5/2006  Suh .................. H01L 27/3211
                                                                313/504
(Continued)

FOREIGN PATENT DOCUMENTS

KR          101645216        10/2013

*Primary Examiner* — Lex H Malsawma
*Assistant Examiner* — Eric W Jones
(74) *Attorney, Agent, or Firm* — Innovation Counsel LLP

(57) ABSTRACT

A display device includes: a substrate including a pixel region and a peripheral region; a plurality of pixels provided in the pixel region, the plurality of pixels including first, second, and third sub-pixels each including a light emitting region; a light emitting element disposed in the light emitting region of each of the first, second, and third sub-pixels; a pixel circuit disposed in each of the first, second, and third sub-pixels, the pixel circuit configured to drive the light emitting element, wherein each pixel includes a first region in which the pixel circuit is disposed and a second region except the first region, wherein the light emitting element disposed in the first sub-pixel overlaps with the pixel circuit, and the light emitting element disposed in the second sub-pixel is disposed in the second region.

16 Claims, 18 Drawing Sheets

(51) Int. Cl.
  *H01L 27/12* (2006.01)
  *G09G 3/3225* (2016.01)
  *G09G 3/3233* (2016.01)
  *G09G 3/3258* (2016.01)

(52) U.S. Cl.
  CPC ............ *G09G 2300/0443* (2013.01); *G09G 2300/0452* (2013.01); *G09G 2300/0819* (2013.01); *G09G 2300/0842* (2013.01); *G09G 2300/0861* (2013.01); *G09G 2300/0866* (2013.01); *G09G 2310/08* (2013.01); *H01L 27/1248* (2013.01); *H01L 27/3265* (2013.01); *H01L 27/3276* (2013.01)

(56) References Cited

U.S. PATENT DOCUMENTS

| | | | | |
|---|---|---|---|---|
| 2006/0187155 A1* | 8/2006 | Chang | ................... | G09G 3/3208 345/76 |
| 2007/0008617 A1* | 1/2007 | Shestak | .............. | G02B 27/2214 359/455 |
| 2011/0284898 A1* | 11/2011 | Iwasaki | ................ | H01L 27/322 257/98 |
| 2014/0062292 A1* | 3/2014 | Seong | ................ | H01L 51/5253 313/504 |
| 2014/0292622 A1* | 10/2014 | Lee | ....................... | G09G 3/3233 345/80 |
| 2015/0090985 A1* | 4/2015 | Park | ................... | H01L 27/3246 257/40 |
| 2016/0181562 A1* | 6/2016 | Pieh | ................... | H01L 51/5218 257/40 |

\* cited by examiner

DISPLAY DEVICE HAVING PIXEL INCLUDING A FIRST REGION IN WHICH A PIXEL CIRCUIT IS DISPOSED

RELATED APPLICATIONS

The present application claims priority to Korean Patent Application No. 10-2016-0179431, filed on Dec. 26, 2016, in the Korean Intellectual Property Office, the entire disclosure of which is incorporated by reference herein.

BACKGROUND

1. Field

An aspect of the present disclosure relates to a display device.

2. Description of the Related Art

As interest in information displays and demand for portable information media increase, research and commercialization has centered on display devices.

Recently, there has been developed a display device including a reflective member to serve as a mirror capable of reflecting an image of an object located at a front surface of the display device.

SUMMARY

Embodiments provide a display device having improved image quality and reflective quality.

According to an aspect of the present disclosure, there is provided a display device including: a substrate including a pixel region and a peripheral region surrounding at least one side of the pixel region; a plurality of pixels disposed in the pixel region, the plurality of pixels including first, second, and third sub-pixels each including a light emitting region that is configured to emit light of a specific color; a light emitting element disposed in the light emitting region of each of the first, second, and third sub-pixels; a pixel circuit provided in each of the first, second, and third sub-pixels, the pixel circuit configured to drive the light emitting element; and an encapsulation member opposite to the substrate. The encapsulation member covers the light emitting element. Each pixel includes a first region in which the pixel circuit is disposed and a second region except the first region, wherein the light emitting device provided in the first sub-pixel overlaps with the pixel circuit, and the light emitting element disposed in the second sub-pixel is disposed in the second region.

The light emitting element disposed in the first sub-pixel may include a first anode electrode overlapping with the pixel circuit.

The first anode electrode may be not disposed in the second region.

The pixel circuit may include: a first pixel circuit disposed in the first sub-pixel; a second pixel circuit disposed in the second sub-pixel, the second pixel circuit being disposed adjacent to the first pixel circuit; and a third pixel circuit disposed in the third sub-pixel, the third pixel circuit being disposed adjacent to the second pixel circuit.

The first anode electrode may overlap with the first pixel circuit.

The first anode electrode may overlap with a portion of the second pixel circuit disposed adjacent to the first pixel circuit.

The first anode electrode may extend along a first direction of the substrate to overlap with all of the first, second, and third pixel circuits.

The light emitting element disposed in the second sub-pixel may include a second anode electrode, and the light emitting element disposed in the third sub-pixel may include a third anode electrode. The second and third anode electrodes may be disposed in the second region.

The third anode electrode may extend from the second region to the first region along a second direction of the substrate, and overlap with the third pixel circuit.

The third anode electrode extending to the first region may overlap with a portion of the second pixel circuit adjacent to the third pixel circuit.

The first, second, and third pixel circuits may not be disposed in the second region.

A corner portion of each of the first, second, and third anode electrodes may have a curved shape.

The corner portion of each of the first, second, and third anode electrodes may have a curvature of at least 20 μm.

The display device may further include a reflective member disposed on one surface of the encapsulation member.

The reflective member may be disposed on the encapsulation member to correspond to both of the first and second regions.

The reflective member may have specular reflection characteristics.

The reflective member may include a metallic material having a constant reflexability.

Each pixel may include: first, second, and third scan lines extending in the first direction of the substrate, which intersects the second direction, the first, second, and third scan lines being sequentially arranged along the second direction, the first, second, and third scan lines configured to supply a scan signal; first, second, and third data lines extending in the second direction, the first, second, and third data lines being sequentially arranged along the first direction, the first, second, and third data lines configured to supply a data signal; and a driving voltage line extending in the second direction, the driving voltage line configured to supply a driving voltage.

The first sub-pixel may be connected to the first, second, and third scan lines and the first data line, the second sub-pixel may be connected to the first, second, and third scan lines and the second data line, and the third sub-pixel may be connected to the first, second, and third scan lines and the third data line.

The display device may further include an organic insulating layer disposed between the pixel circuit and the light emitting element.

The organic insulating layer may include: a protective layer disposed between the pixel circuit and the light emitting element; and a pixel defining layer disposed on the protective layer.

The pixel defining layer may have a black color.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
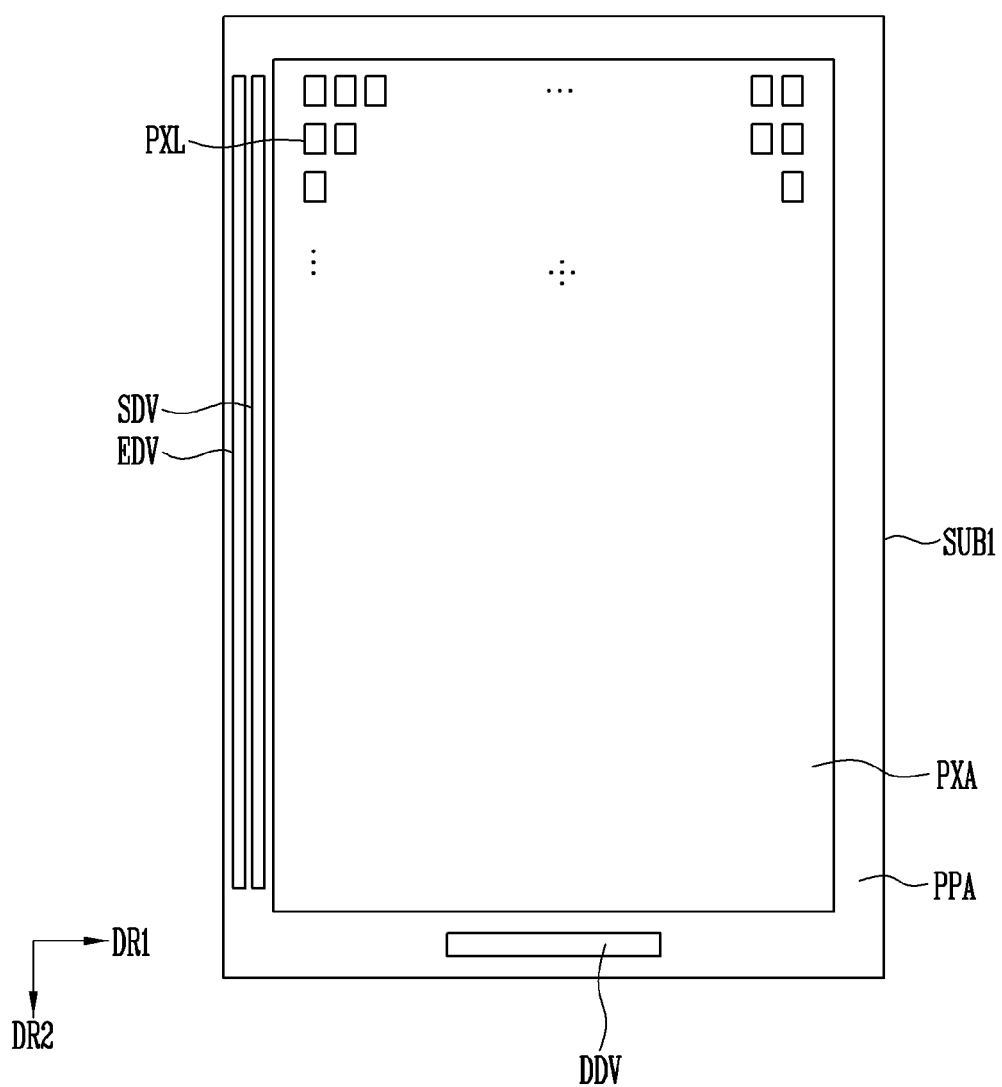
FIG. 1 is a plan view illustrating a display device according to an embodiment of the present disclosure.

The present disclosure may apply to various changes and different shapes, therefore only illustrated in details are particular examples. However, the examples do not limit to certain shapes but apply to all the changes and equivalent materials and replacements. The drawings included are illustrated in a fashion where the figures are expanded for the better understanding.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

Hereinafter, exemplary embodiments of the present disclosure will be described in detail with reference to the accompanying drawings.

FIG. 1 is a plan view illustrating a display device according to an embodiment of the present disclosure. In FIG. 1, the display device includes first and second substrates opposite to each other, but illustration of the second substrate opposite to the first substrate is omitted for convenience of description.

Referring to FIG. 1, the display device according to the embodiment of the present disclosure may include a first substrate SUB1, pixels PXL disposed on the first substrate SUB1, a drive unit disposed on the first substrate SUB1, the drive unit driving the pixels PXL, and a line unit (not shown) connecting the pixels PXL and the drive unit.

The first substrate SUB1 may include a pixel region PXA and a peripheral region PPA. The pixel area PXA may be a region in which the pixels PXL displaying an image are provided. Each pixel PXL will be described later. The peripheral region PPA is a region in which the pixels PXL are not provided, and may be a non-display region in which an image is not displayed. The drive unit for driving the pixels PXL and some of lines (not shown) connecting the pixels PXL and the drive unit may be provided in the peripheral region PPA. The peripheral region PPA corresponds to a bezel in a final display device, and the width of the bezel may be determined according to the width of the peripheral region PPA.

The pixel region PXA may have various shapes. For example, the pixel region PXA may be provided in various shapes such as a closed-shape polygon including linear sides, a circle, an ellipse, etc., including curved sides, and a semicircle, a semi-ellipse, etc., including linear and curved sides. When the pixel region PXA includes a plurality of regions, each region may also be provided in various shapes such as a closed-shape polygon including linear sides, a circle, an ellipse, etc., including curved sides, and a semicircle, a semi-ellipse, etc., including linear and curved sides. In addition, areas of the plurality of regions may be the same or different from one another.

In the embodiment of the present disclosure, a case where the pixel region PXA is provided as one region having a quadrangular shape including linear sides is described as an example.

The peripheral region PPA may be provided at at least one side of the pixel region PXA. In an embodiment of the present disclosure, the peripheral region PPA may surround the circumference of the pixel region PXA. In an embodiment of the present disclosure, the peripheral region PPA may include a lateral part extending in a first direction DR1 and a longitudinal part extending in a second direction DR2. The longitudinal part of the peripheral region PPA may be provided in a pair spaced apart from each other along the width direction of the pixel region PXA.

The pixels PXL may be provided in the pixel region PXA on the first substrate SUB1. Each of the pixels PXL is a minimum unit for displaying an image, and may be provided in plurality. Each of the pixels PXL may include a light emitting device that emits white light and/or colored light.

The pixels PXL may be provided in plurality to be arranged in a matrix form along rows extending in the first direction DR1 and columns extending in the second direction DR2. However, the arrangement form of the pixels PXL is not particularly limited, and the pixels PXL may be arranged in various forms. For example, some of the pixels PXL may be arranged such that the first direction DR1 becomes a row direction, but other some of the pixels PXL may be arranged such that a direction different from the first direction, e.g., a direction oblique to the first direction DR1 becomes a row direction. Alternatively, the pixels PXL may be arranged such that a direction inclined to the first direction DR1 and the second direction DR2 becomes a column direction and such that a direction intersecting the column direction becomes a row direction. Here, the column direction may also be inclined to the first direction DR1 and the second direction DR2.

The drive unit provides a signal to each pixel PXL through the line unit, and accordingly, the driving of the pixel PXL can be controlled. In FIG. 1, the line unit is omitted for convenience of description. The line unit will be described later.

The drive unit may include a scan driver SDV providing a scan signal to the pixel PXL through a scan line, a light emitting driver EDV providing a light emitting control signal to the pixel PXL through a light emitting control line, a data driver DDV providing a data signal to the pixel PXL through a data line, and a timing controller (not shown). The timing controller may control the scan driver SDV, the light emitting driver EDV, and the data driver DDV.

The scan driver SDV may be disposed at the longitudinal part in the peripheral region PPA. Since the longitudinal part of the peripheral region PPA is provided in a pair spaced apart from each other along the width direction of the pixel region PXA, the scan driver SDV may be disposed at at least one of the longitudinal parts in the peripheral region PPA. The scan driver SDV may extend long along the length direction of the peripheral region PPA.

In an embodiment of the present disclosure, the scan driver SDV may be directly mounted on the first substrate SUB1. When the scan driver SDV is directly mounted on the first substrate SUB1, the scan driver SDV may be formed together with the pixels PXL in a process of forming the pixels PXL. However, the mounting position and forming method of the scan driver SDV are not limited thereto. For example, the scan driver SDV may be formed on a separate chip to be provided in a chip on glass form on the first substrate SUB1. Alternatively, the scan driver SDV may be mounted on a printed circuit board to be connected to the first substrate SUB1 through a connection member.

Similarly to the scan driver SDV, the light emitting driver EDV may be disposed at the longitudinal part in the peripheral region PPA. The light emitting driver EDV may be disposed at at least one of the longitudinal parts in the peripheral region PPA. The light emitting driver EDV may extend long along the length direction of the peripheral region PPA.

In an embodiment of the present disclosure, the light emitting driver EDV may be directly mounted on the first substrate SUB1. When the light emitting driver EDV is directly mounted on the first substrate SUB1, the light emitting driver EDV may be formed together with the pixels PXL in a process of forming the pixels PXL. However, the mounting position and forming method of the light emitting driver EDV are not limited thereto. For example, the light emitting driver EDV may be formed on a separate chip to be provided in a chip on glass form on the first substrate SUB1. Alternatively, the light emitting driver EDV may be mounted on a printed circuit board to be connected to the first substrate SUB1 through a connection member.

In an embodiment of the present disclosure, a case where the scan driver SDV and the light emitting driver EDV are adjacent to each other and formed at any one of the pair of longitudinal parts of the peripheral region PPA is illustrated as an example. However, the present disclosure is not limited thereto, and the arrangement of the scan driver SDV and the light emitting driver EDV may be modified in various manners. For example, the scan driver SDV may be provided at one of the longitudinal parts of the peripheral region PPA, and the light emitting driver EDV may be provided at the other of the longitudinal parts of the peripheral region PPA. Alternatively, the scan driver SDV may be provided at both of the longitudinal parts of the peripheral region PPA, and the light emitting driver EDV may be provided at only one of the longitudinal parts of the peripheral region PPA.

The data driver DDV may be disposed in the peripheral region PPA. Particularly, the data driver DDV may be disposed at the lateral part of the peripheral region PPA. The data driver DDV may extend long along the width direction of the peripheral region PPA.

Figure 2:
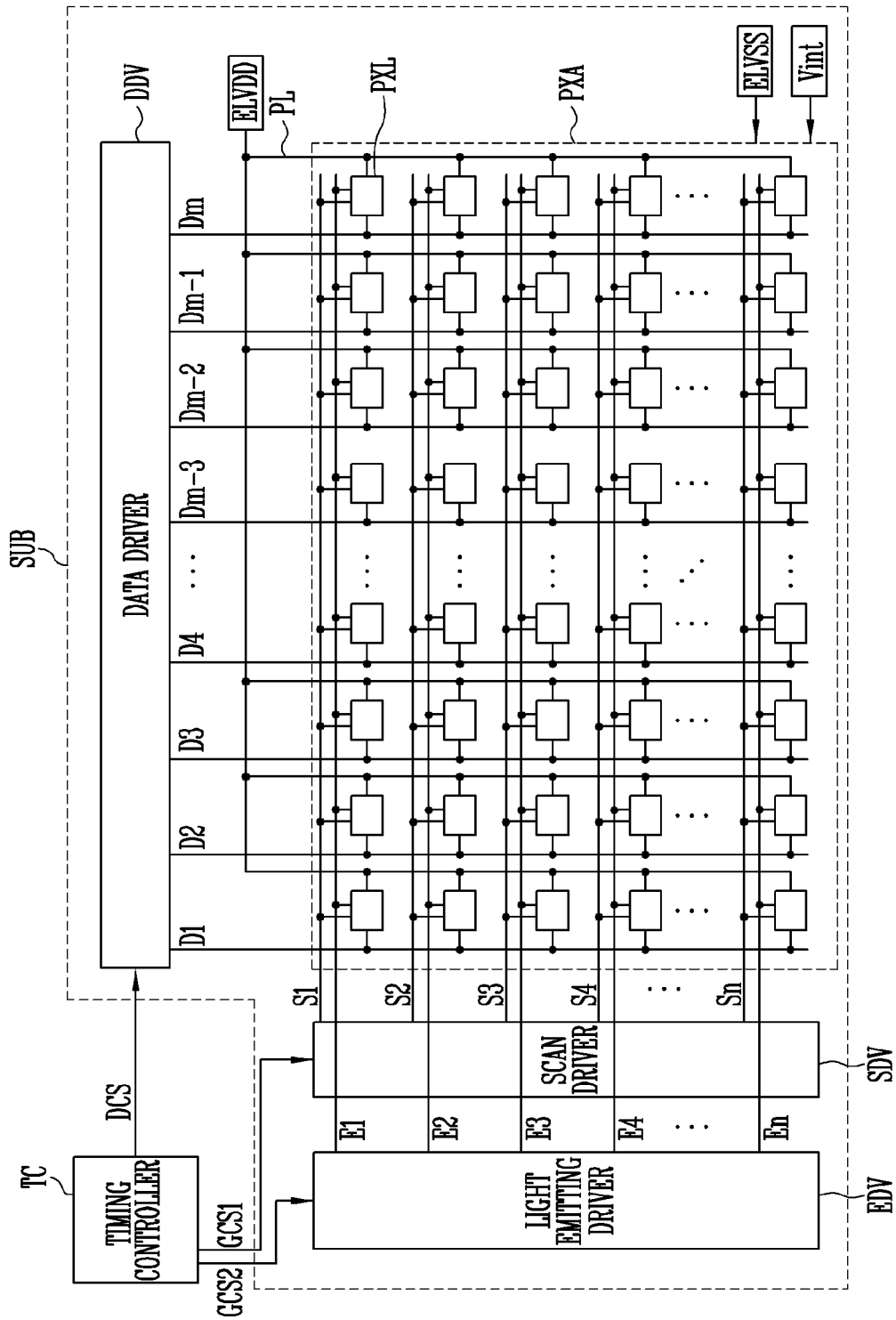
FIG. 2 is a block diagram illustrating an embodiment of pixels and a drive unit in the display device of FIG. 1.

FIG. 2 is a block diagram illustrating an embodiment of the pixels and the drive unit in the display device of FIG. 1.

Referring to FIGS. 1 and 2, the display device according to the embodiment of the present disclosure may include pixels PXL, a drive unit, and a line unit.

The pixels PXL may be provided in plurality. The drive unit may include a scan driver SDV, a light emitting driver EDV, a data driver DDV, and a timing controller TC. In FIG. 2, positions of the scan driver SDV, the light emitting driver EDV, the data driver DDV, and the timing controller TC are set for convenience of description. When an actual display device is implemented, the scan driver SDV, the light emitting driver EDV, the data driver DDV, and the timing controller TC may be disposed at other positions in the display device.

The line unit provides signals from the drive unit to each pixel PXL, and may include scan lines, data lines, light emitting control lines, a power line PL, and an initialization power line (not shown). The scan lines may include a plurality of scan lines S1 to Sn, and the light emitting control lines may include a plurality of light emitting control lines E1 to En. The data lines may include a plurality of data lines D1 to Dm. The data lines D1 to Dm and the power line PL may be connected to the pixels PXL.

The pixels PXL may be arranged in a pixel region PXA. The pixels PXL may be connected to the scan lines S1 to Sn, the light emitting control lines E1 to En, the data lines D1 to Dm, and the power line PL. The pixels PXL may be supplied with a data signal from the data lines D1 to Dm when a scan signal is supplied from the scan lines S1 to Sn.

Also, the pixels PXL may be supplied with a first power source ELVDD, a second power source ELVSS, and an initialization power source Vint from the outside. Here, the first power source ELVDD may be applied through the power line PL.

Each of the pixels PXL may include a driving transistor (not shown) and a light emitting device (not shown). The driving transistor may control the amount of current flowing from the first power source ELVDD to the second power source ELVSS via the light emitting device, corresponding to the data signal. Here, before the data signal is supplied, a gate electrode of the driving transistor may be initialized by a voltage of the initialization power source Vint. To this end, the initialization power source Vint may be set to a lower voltage than the data signal.

The scan driver SDV may supply the scan signal to the scan lines S1 to Sn in response to a first gate control signal GCS1 from the timing controller TC. For example, the scan driver SDV may sequentially supply the scan signal to the scan lines S1 to Sn. If the scan signal is sequentially supplied to the scan lines S1 to Sn, the pixels PXL may be sequentially selected in units of horizontal lines.

The light emitting driver EDV may supply the light emitting control signal to the light emitting control lines E1 to En in response to a second gate control signal GCS2 from the timing controller TC. For example, the light emitting driver EDV may sequentially supply the light emitting control signal to the light emitting control lines E1 to En.

Here, the light emitting control signal may be set to have a wider width than the scan signal. For example, a light emitting control signal supplied to an ith (i is a natural number) light emitting control line Ei may be supplied to overlap with, for at least one period, a scan signal supplied to an (i−1)th first scan line Si−1 and a scan signal supplied to an ith first scan line Si.

Additionally, the light emitting control signal may be set to a gate-off voltage (e.g., a high voltage) such that transistors included in the pixels PXL can be turned off, and the scan signal may be set to a gate-on voltage (e.g., a low voltage) such that the transistors included in the pixels PXL can be turned on.

The data driver DDV may supply the data signal to the data lines D1 to Dm in response to a data control signal DCS. The data signal supplied to the data lines D1 to Dm may be supplied to pixels PXL selected by the scan signal.

The timing controller TC may supply, to the scan drivers SDV and the light emitting drivers EDV, the gate control signals GCS1 and GCS2 generated based on timing signals supplied from the outside. Also, the timing controller TC may supply the data control signal DCS to the data driver DDV.

A start pulse and clock signals may be included in each of the gate control signals GCS1 and GCS2. The start pulse may control a timing of a first scan signal or a first light emitting control signal. The clock signals may be used to shift the start pulse.

A source start pulse and clock signals may be included in the data control signal DCS. The source start pulse may control a sampling start time of data. The color signals may be used to control a sampling operation.

Figure 3:
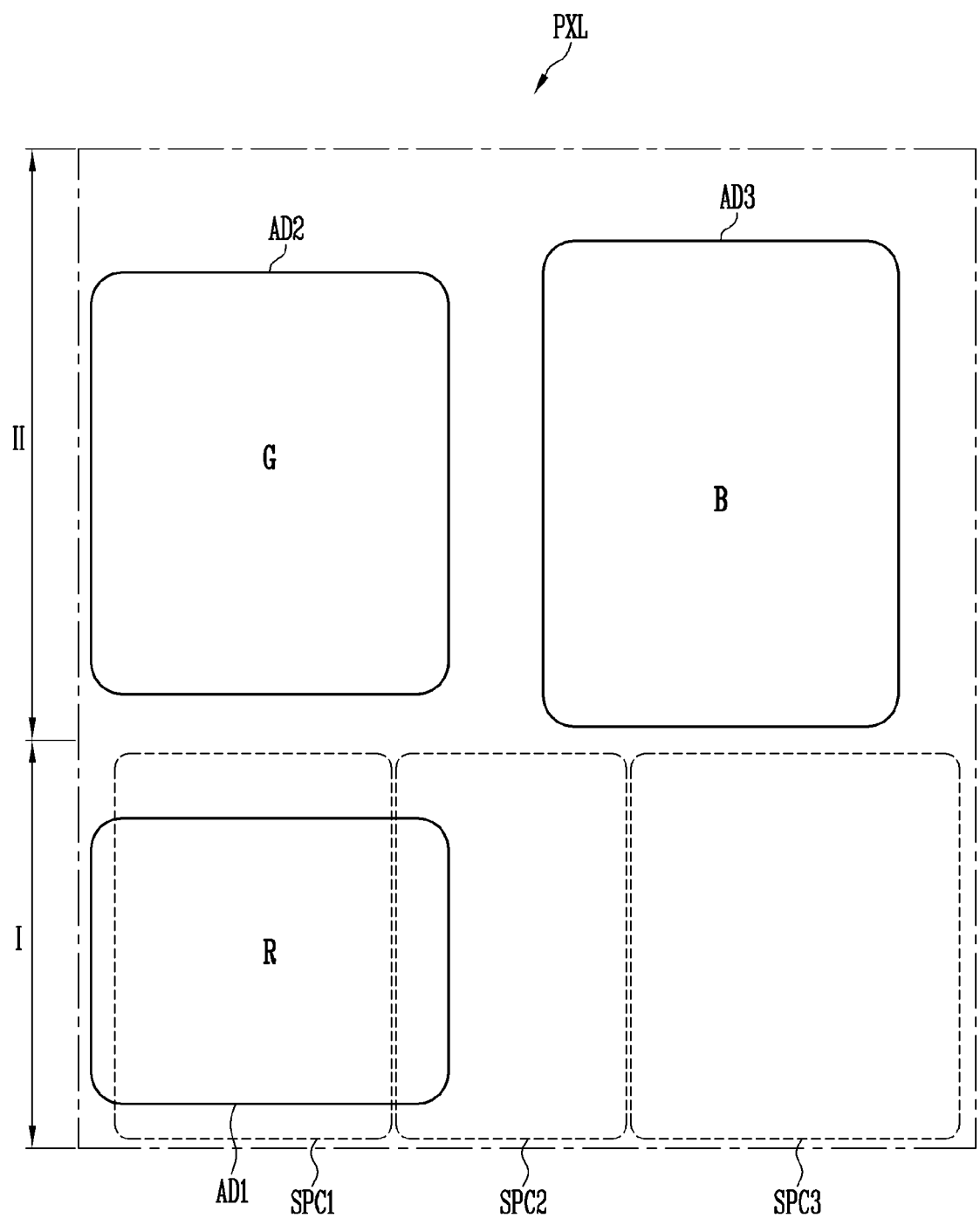
FIG. 3 is a plan view schematically illustrating one pixel among the pixels shown in FIG. 1.

FIG. 3 is a plan view schematically illustrating one pixel among the pixels shown in FIG. 1.

Referring to FIGS. 1 and 3, the pixel PXL according to the embodiment of the present disclosure may include first, second, and third sub-pixels, sometime called first to third sub-pixels.

The first sub-pixel may include a first light emitting region R that emits red light and a first sub-pixel circuit SPC1 for driving the first light emitting region R. The second sub-pixel may include a second light emitting region G that emits green light and a second sub-pixel circuit SPC2 for driving the second light emitting region G. The third sub-pixel may include a third light emitting region B that emits blue light and a third sub-pixel circuit SPC3 for driving the third light emitting region B.

The first sub-pixel circuit SPC1 may be electrically connected to a first anode electrode AD1, the second sub-pixel circuit SPC2 may be electrically connected to a second anode electrode AD2, and the third sub-pixel circuit SPC3 may be electrically connected to a third anode electrode AD3.

The first anode electrode AD1 may correspond to the first light emitting region R, the second anode electrode AD2 may correspond to the second light emitting region G, and the third anode electrode AD3 may correspond to the third light emitting region B. When viewed on a plane, corner portions of each of the first, second, and third anode electrodes AD1, AD2, and AD3, sometimes called first to third anode electrodes AD1 to AD3, may have a curved shape.

Each pixel PXL may include a first region I and a second region II. The first region I may be a region in which the first, second, and third sub-pixel circuits SPC1, SPC2, and SPC3, sometimes called the first to third sub-pixel circuits SPC1 to SPC3, are disposed and the second region II may be a region except the first region I. That is, the first to third sub-pixel circuits SPC1 to SPC3 may be disposed in only the first region I that is a specific region of each pixel PXL. As the first to third sub-pixel circuits SPC1 to SPC3 are intensively disposed in only the first region I of each pixel, the aperture ratio of each pixel PXL can be improved, and the light transmittance of each pixel PXL can also be increased.

Meanwhile, the first anode electrode AD1 may be provided in the first region I, and the second and third anode electrodes AD2 and AD3 may be provided in the second region II.

A connection relationship between the first to third sub-pixel circuits SPC1 to SPC3 and the first to third anode electrodes AD1 to AD3 will be described later with reference to FIG. 7.

Figure 4:
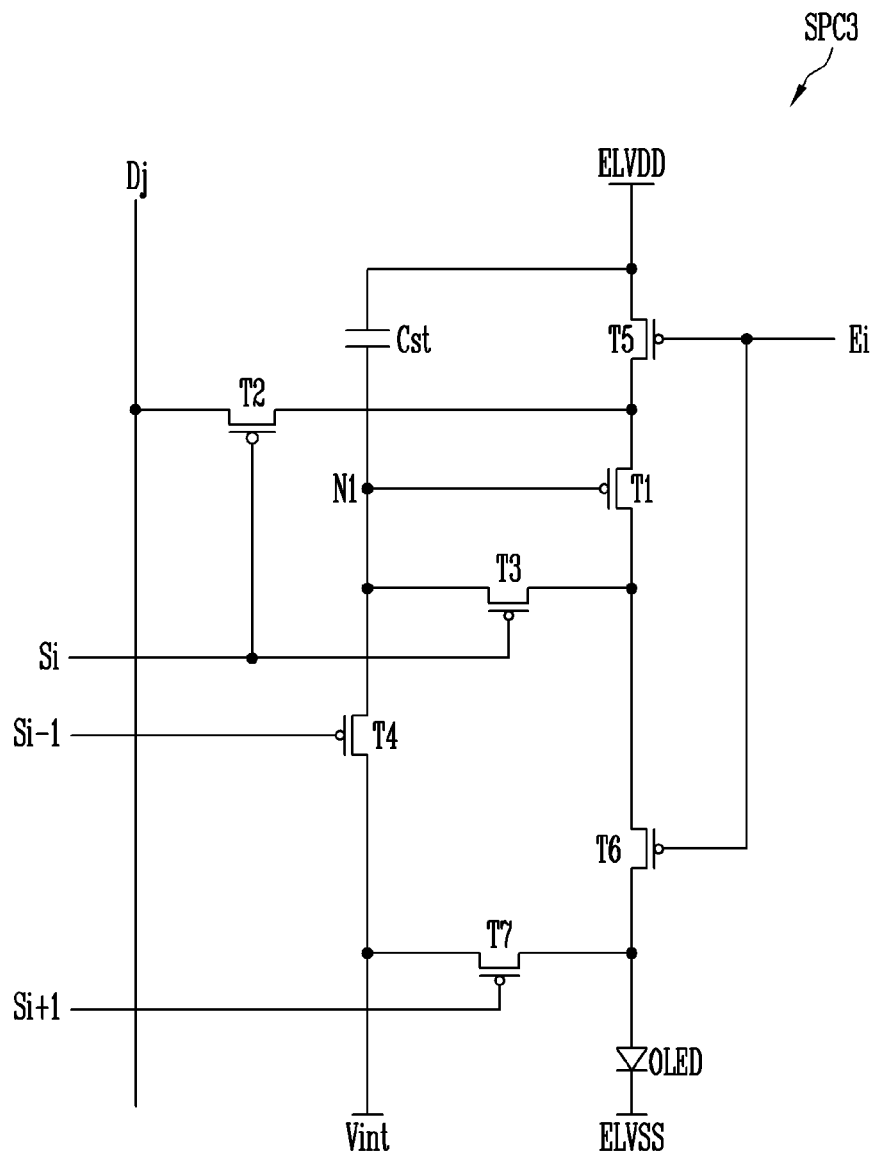
FIG. 4 is an equivalent circuit diagram illustrating a third sub-pixel circuit shown in FIG. 3.

FIG. 4 is an equivalent circuit diagram illustrating the third sub-pixel circuit shown in FIG. 3. For convenience of description, a third sub-pixel circuit connected to a jth data line Dj and an ith scan line Si has been illustrated in FIG. 4.

Referring to FIGS. 3 and 4, the third sub-pixel circuit SPC3 according to the embodiment of the present disclosure may include first, second, third, fourth, fifth, sixth, and seventh transistors T1, T2, T3, T4, T5, T6, and T7, sometimes called first to seventh transistors T1 to T7, and a storage capacitor Cst. The first to seventh transistors T1 to T7 may be electrically connected to a corresponding light emitting diode OLED.

The third anode electrode AD3 of the light emitting diode OLED may be connected to the first transistor T1 via the sixth transistor T6, and a cathode electrode of the light emitting diode OLED may be connected to a second power source ELVSS. The light emitting diode OLED may generate light with a predetermined luminance corresponding to the amount of current supplied from the first transistor T1.

A first power source ELVDD may be set to a higher voltage than the second power source ELVSS such that current can flow through the light emitting diode OLED.

The seventh transistor T7 may be connected between an initialization power source Vint and the third anode electrode AD3 of the light emitting diode OLED. In addition, a gate electrode of the seventh transistor T7 may be connected to an (i+1)th scan line Si+1. The seventh transistor T7 may be turned on when a scan signal is supplied to the (i+1)th scan line Si+1 to supply a voltage of the initialization power source Vint to the third anode electrode AD3 of the light emitting diode OLED. Here, the initialization power source Vint may be set to a lower voltage than a data signal.

The sixth transistor T6 may be connected between the first transistor T1 and the light emitting diode OLED. In addition, a gate electrode of the sixth transistor T6 may be connected to an ith light emitting control line Ei. The sixth transistor T6 may be turned off when a light emitting control signal is supplied to the ith light emitting control line Ei, and turned on otherwise.

The fifth transistor T5 may be connected between the first power source ELVDD and the first transistor T1. In addition, a gate electrode of the fifth transistor T5 may be connected to the ith light emitting control line Ei. The fifth transistor T5 may be turned off when the light emitting control signal is supplied to the ith light emitting control line Ei, and turned on otherwise.

A first electrode of the first transistor (driving transistor) T1 may be connected to the first power source ELVDD via the fifth transistor T5, and a second electrode of the first transistor T1 may be connected to the third anode electrode AD3 of the light emitting diode OLED via the sixth transistor T6. In addition, a gate electrode of the first transistor T1 may be connected to a first node N1. The first transistor T1 may control the amount of current flowing from the first power source ELVDD to the second power source ELVSS via the light emitting diode OLED, corresponding to a voltage of the first node N1.

The third transistor T3 may be connected between the second electrode of the first transistor T1 and the first node N1. In addition, a gate electrode of the third transistor T3 may be connected to the ith scan line Si. The third transistor T3 may be turned on when the scan signal is supplied to the ith scan line Si to allow the second electrode of the first transistor T1 and the first node N1 to be electrically connected to each other. Therefore, the first transistor T1 may be diode-connected when the third transistor T3 is turned on.

The fourth transistor T4 may be connected between the first node N1 and the initialization power source Vint. In addition, a gate electrode of the fourth transistor T4 may be connected to an (i−1)th scan line Si−1. The fourth transistor T4 may be turned on when the scan signal is supplied to the (i−1)th scan line Si−1 to supply the voltage of the initialization power source Vint to the first node N1.

The second transistor T2 may be connected between the jth data line Dj and the first electrode of the first transistor T1. In addition, a gate electrode of the second transistor T2 may be connected to the ith scan line Si. The second transistor T2 may be turned on when the scan signal is supplied to the ith scan line Si to allow the jth data line Dj and the first electrode of the first transistor T1 to be electrically connected to each other.

The storage capacitor Cst may be connected between the first power source ELVDD and the first node N1. The storage capacitor Cst may store a voltage corresponding to the data signal and a threshold voltage of the first transistor T1.

Figure 5:
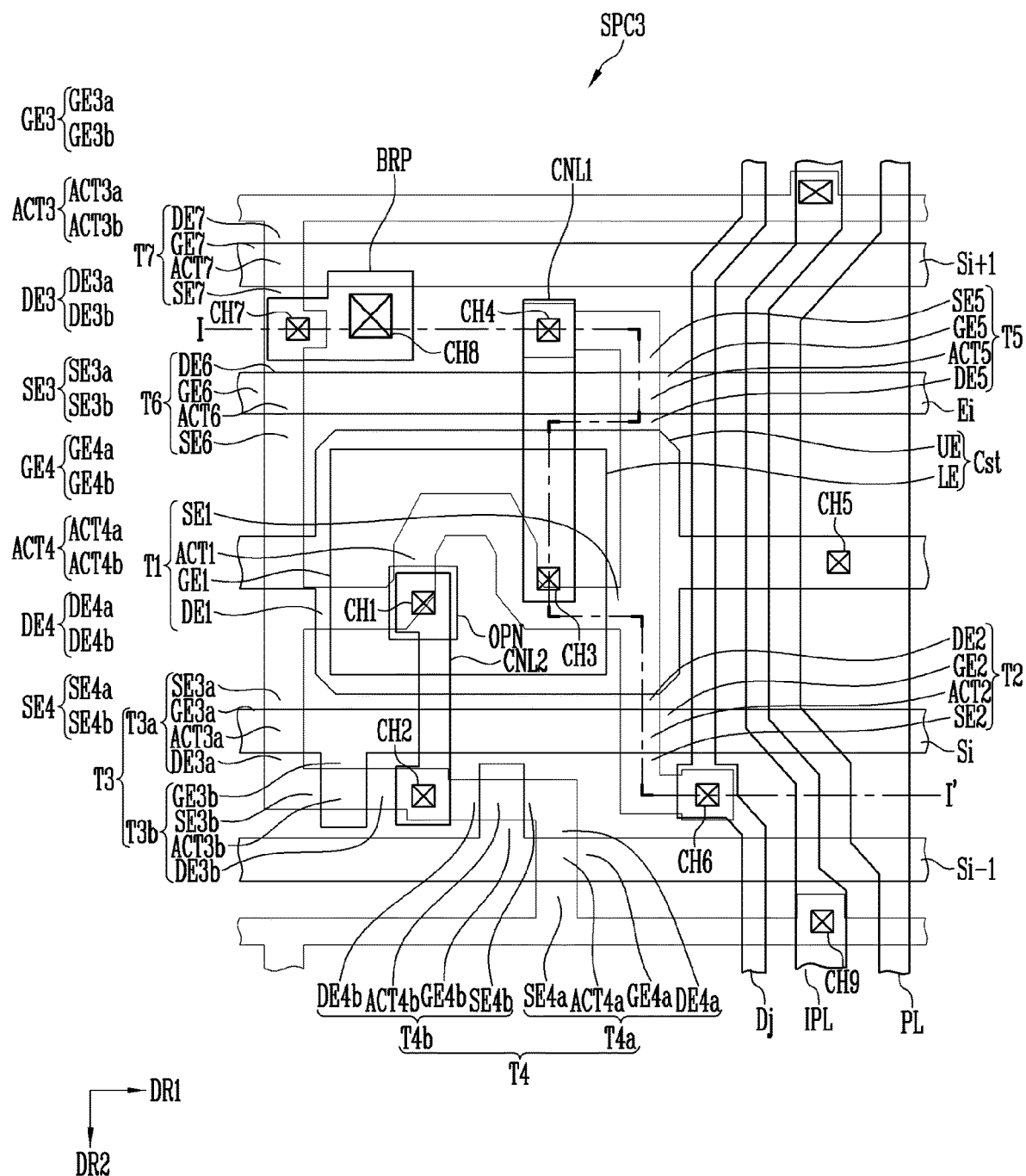
FIG. 5 is a plan view illustrating in detail the third sub-pixel circuit shown in FIG. 4.
Figure 6:
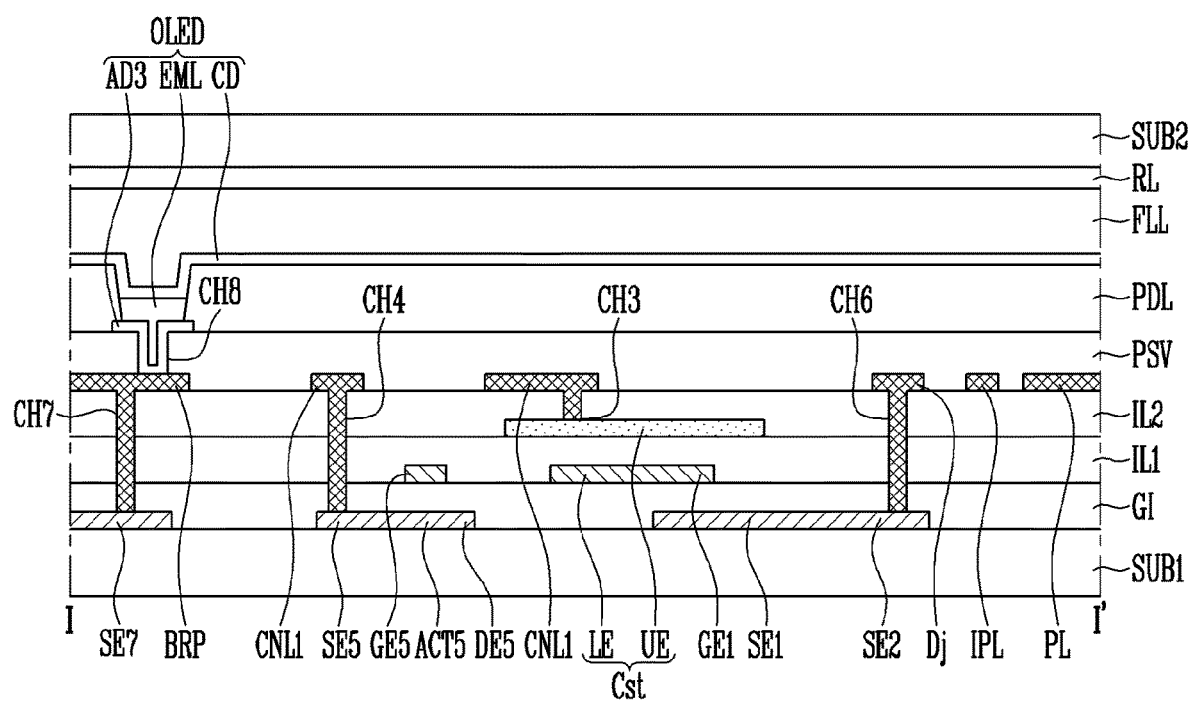
FIG. 6 is a sectional view taken along line I-I' of FIG. 5.

FIG. 5 is a plan view illustrating in detail the third sub-pixel circuit shown in FIG. 4. FIG. 6 is a sectional view taken along line I-I' of FIG. 5.

Based on one sub-pixel disposed on an ith row and a jth column in the pixel region, three scan lines Si−1, Si, and Si+1, a light emitting control line Ei, a power line PL, and a data line Dj, which are connected to the one sub-pixel, have been illustrated in FIGS. 5 and 6. In FIGS. 5 and 6, for convenience of description, a scan line on an (i−1)th row is referred to as an "(i−1)th scan line Si−1," a scan line on the ith row is referred to as an "ith scan line Si," a scan line on the (i+1)th row is referred to as an "(i+1)th scan line Si+1," a light emitting control line on the ith row is referred to as a "light emitting control line Ei," a data line on the jth column is referred to as a "data line Dj," and a power line and an initialization power line on the jth column is referred to as a "power line PL" and an "initialization power line IPL."

Referring to FIGS. 4 to 6, the display device according to the embodiment of the present disclosure includes a first substrate SUB1, a line unit, pixels PXL, and a second substrate SUB2 opposite to the first substrate SUB1.

The first substrate SUB1 may be made of an insulative material such as glass or resin. Also, the first substrate SUB1 may be made of a material having flexibility or elasticity to be bendable or foldable. The first substrate SUB1 may have a single-layered structure or a multi-layered structure.

For example, the first substrate SUB1 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the first substrate SUB1 may be variously changed, and the first substrate SUB1 may be made of fiber glass reinforced plastic (FRP), or the like.

The line unit provides signals to each of the pixels PXL, and may include scan lines Si−1, Si, and Si+1, a data line Dj, a light emitting control line Ei, a power line PL, and an initialization power line IPL.

The scan lines Si−1, Si, and Si+1 extend in a first direction DR1, and include an (i−1)th scan line Si−1, an ith scan line Si, and an (i+1)th scan line, which are sequentially arranged along a second direction DR2. A scan signal is applied to the scan lines Si−1, Si, and Si+1. An (i−1)th scan signal is applied to the (i−1)th scan line Si−1, an ith scan signal is applied to the ith scan line Si, and an (i+1)th scan signal is applied to the (i+1)th scan line Si+1.

The light emitting control line Ei extends in the first direction DR1, and is disposed between the ith scan line Si and the (i+1)th scan line Si+1 to be spaced apart from the ith scan line Si and the (i+1)th scan line Si+1. A light emitting control signal is applied to the light emitting control line Ei.

The data line Dj extends in the second direction DR2. A data signal is applied to the data line Dj.

The power line PL extends along the second direction DR2, and is disposed to be spaced apart from the data line Dj. A first power source ELVDD is applied to the power line PL.

The initialization power line IPL is provided between the data line Dj and the power line PL, which extend along the second direction DR2. An initialization power source Vint is applied to the initialization power line IPL.

Each pixel PXL may include first to third sub-pixels. The first sub-pixel may include a first sub-pixel circuit (see the first sub-pixel circuit SPC1 of FIG. 3) and a light emitting device (not shown) connected to the first sub-pixel circuit SPC1. The second sub-pixel may include a second sub-pixel circuit (see the second sub-pixel circuit SPC2 of FIG. 3) and a light emitting device (not shown) connected to the second sub-pixel circuit SPC2. The third sub-pixel may include a third sub-pixel circuit (see the third sub-pixel circuit SPC3 of FIG. 3) and a light emitting diode OLED connected to the third sub-pixel circuit SPC3. Each of the first to third sub-pixel circuits SPC1 to SPC3 may include first to seventh transistors T1 to T7 and storage capacitor Cst.

Hereinafter, the third sub-pixel circuit SPC3 will be representatively illustrated for convenience of description.

The first transistor T1 may include a first gate electrode GE1, the first active pattern ACT1, a first source electrode SE1, a first drain electrode DE1, and a second contact line CNL2.

The first gate electrode GE1 may be connected to a third drain electrode DE3 of the third transistor T3 and a fourth drain electrode DE4 of the fourth transistor T4. The second contact line CNL2 may connect between the first gate electrode GE1 and the third and fourth drain electrodes DE3 and DE4. One end of the second contact line CNL2 may be connected to the first gate electrode GE1 through a first contact hole CH1, and the other end of the second contact line CNL2 may be connected to the third and fourth drain electrodes DE3 and DE4 through a second contact hole CH2.

In an embodiment of the present disclosure, the first active pattern ACT1, the first source electrode SE1, and the first drain electrode DE1 may be formed of a semiconductor layer undoped or doped with impurities. For example, the first source electrode SE1 and the first drain electrode DE1 may be formed of a semiconductor layer doped with impurities, and the active pattern ACT1 may be formed of a semiconductor layer undoped with impurities.

The first active pattern ACT1 has a bar shape extending in a predetermined direction, and may have a shape in which it is bent plural times along the extending direction. The first active pattern ACT1 overlaps with the first gate electrode GE1 when viewed on a plane. As the first active pattern ACT1 is formed long, the driving range of gate voltage applied to the first transistor T1 is widened. Accordingly, the gray scale of light emitted from the light emitting diode OLED can be minutely controlled.

One end of the first source electrode SE1 may be connected to one end of the first active pattern ACT1, and the other end of the first source electrode SE1 may be connected to a second drain electrode DE2 of the second transistor T2 and a fifth drain electrode DE5 of the fifth transistor T5. One end of the first drain electrode DE1 may be connected to the other end of the first active pattern ACT1, and the other end of the first drain electrode DE1 may be connected to a third source electrode SE3 of the third transistor T3 and a sixth source electrode SE6 of the sixth transistor T6.

The second transistor T2 may include a second gate electrode GE2, a second active pattern ACT2, and a second source electrode SE2, and the second drain electrode DE2.

The second gate electrode GE2 is connected to the ith scan line Si. The second gate electrode GE2 is provided as a portion of the ith scan line Si or provided in a shape protruding from the ith scan line Si. In an embodiment of the present disclosure, the second active pattern ACT2, the second source electrode SE2, and the second drain electrode DE2 may be formed of a semiconductor undoped or doped with impurities. The second source electrode SE2 and the second drain electrode DE2 may be formed of a semiconductor doped with impurities, and the second active pattern ACT2 may be formed of a semiconductor layer undoped with impurities. The second active pattern ACT2 corresponds to a portion overlapping with the second gate electrode GE2. One end of the second source electrode SE2 may be connected to the second active pattern ACT2, and the other end of the second source electrode SE2 may be connected to the data line Dj through a sixth contact hole CH6. One end of the second drain electrode DE2 may be connected to the second active pattern ACT2, and the other end of the second drain electrode DE2 may be connected to the first source electrode SE1 of the first transistor T1 and the fifth drain electrode DE5 of the fifth transistor T5.

The third transistor T3 may be provided in a double gate structure so as to prevent a leakage current. That is, the third transistor T3 may include a 3ath transistor T3a and a 3bth transistor T3b. The 3ath transistor T3a may include a 3ath gate electrode GE3a, a 3ath active pattern ACT3a, a 3ath source electrode SE3a, and a 3ath drain electrode DE3a. The 3bth transistor T3b may include a 3bth gate electrode GE3b, a 3bth active pattern ACT3a, a 3bth source electrode SE3b, and a 3bth drain electrode DE3b. Hereinafter, the 3ath gate electrode GE3a and the 3bth gate electrode GE3b are referred to as a third gate electrode GE3, the 3ath active pattern ACT3a and the 3bth active pattern ACT3b are referred to as a third active pattern ACT3, the 3ath source electrode SE3a and the 3bth source electrode SE3b are referred to as the third source electrode SE3, and the 3ath drain electrode DE3a and the 3bth drain electrode DE3b are referred to as the third drain electrode DE3.

The third gate electrode GE3 is connected to the ith scan line Si. The third gate electrode GE3 is provided as a portion of the ith scan line Si or provided in a shape protruding from the ith scan line Si. The third active pattern ACT3, the third source electrode SE3, and the third drain electrode DE3 may be formed of a semiconductor layer undoped or doped with impurities. The third source electrode SE3 and the third drain electrode DE3 may be formed of a semiconductor layer undoped with impurities. The third active pattern ACT3 corresponds to a portion overlapping with the third gate electrode GE3. One end of the third source electrode SE3 may be connected to the third active pattern ACT3, and the other end of the third source electrode SE3 may be connected to the first drain electrode DE1 of the first transistor T1 and the sixth source electrode SE6 of the sixth transistor T6. One end of the third drain electrode DE3 may be connected to the third active pattern ACT3, and the other end of the third drain electrode DE3 may be connected to the fourth drain electrode DE4 of the fourth transistor T4. Also, the third drain electrode DE3 may be connected to the first gate electrode GE1 of the first transistor T1 through the first and second contact holes CH1 and CH2 and the second contact line CNL2.

The fourth transistor T4 may be provided in a double gate structure so as to prevent a leakage current. That is, the fourth transistor T4 may include a 4ath transistor T4a and a 4bth transistor T4b. The 4ath transistor T4a may include a 4ath gate electrode GE4a, a 4ath active pattern ACT4a, a 4ath source electrode SE4a, and a 4ath drain electrode DE4a, and the 4bth transistor T4b may include a 4bth gate electrode GE4b, a 4bth active pattern ACT4b, a 4bth source electrode SE4b, and a 4bth drain electrode DE4b. Hereinafter, the 4ath gate electrode GE4a and the 4bth gate electrode GE4b are referred to as a fourth gate electrode GE4, the 4ath active pattern ACT4a and the 4bth active pattern ACT4b are referred to as a fourth active pattern ACT4, the 4ath source electrode SE4a and the 4bth source electrode SE4b are referred to as a fourth source electrode SE4, and the 4ath drain electrode DE4a and the 4bth drain electrode DE4b are referred to as the fourth drain electrode DE4.

The fourth gate electrode GE4 is connected to the (i−1)th scan line Si−1. The fourth gate electrode GE4 is provided as a portion of the (i−1)th scan line Si−1 or provided in a shape protruding from the (i−1)th scan line Si−1. The fourth active pattern ACT4, the fourth source electrode SE4, and the fourth drain electrode DE4 may be formed of a semiconductor layer undoped or doped with impurities. The fourth source electrode SE4 and the fourth drain electrode DE4 may be formed of a semiconductor layer doped with impurities, and the fourth active pattern ACT4 may be formed of a semiconductor layer undoped with impurities. The fourth active pattern ACT4 corresponds to a portion overlapping with the fourth gate electrode GE4. One end of the fourth source electrode SE4 may be connected to the fourth active pattern ACT4, and the other end of the fourth source electrode SE4 may be connected to the initialization power line IPL through a ninth contact hole CH9. In addition, the other end of the fourth source electrode SE4 may be connected to a seventh drain electrode DE7 of a seventh transistor T7 of a pixel on a previous row. One end of the fourth drain electrode DE4 may be connected to the fourth active pattern ACT4, and the other end of the fourth drain electrode DE4 may be connected to the third drain electrode DE3 of the third transistor T3. Also, the fourth drain electrode DE4 may be connected to the first gate electrode GE1 of the first transistor T1 through the first and second contact holes CH1 and CH2 and the second contact line CNL2.

The fifth transistor T5 may include a fifth gate electrode GE5, a fifth active pattern ACT5, a fifth source electrode SE5, and the fifth drain electrode DE5.

The fifth gate electrode GE5 is connected to the light emitting control line Ei. The fifth gate electrode GE5 may be provided as a portion of the light emitting control line Ei or may be provided in a shape protruding from the light emitting control line Ei. The fifth active pattern ACT5, the fifth source electrode SE5, and the fifth drain electrode DE5 may be formed of a semiconductor layer undoped or doped with impurities. The fifth source electrode SE5 and the fifth drain electrode DE5 may be formed of a semiconductor layer doped with impurities, and the fifth active pattern ACT5 may be formed of a semiconductor layer undoped with impurities. The fifth active pattern ACT5 corresponds to a portion overlapping with the fifth gate electrode GE5. One end of the fifth source electrode SE5 may be connected to the fifth active pattern ACT5, and the other end of the fifth source electrode SE5 may be connected to the power line PL. Here, since a first contact line CNL1 is provided between the fifth source electrode SE5 and the power line PL, one end of the first contact line CNL1 may be connected to the fifth source electrode SE5 through a fourth contact hole CH4, and the other end of the first contact line CNL1 may be connected to an upper electrode UE of a storage capacitor Cst through a third contact hole CH3. The upper electrode UE may be connected to the power line PL through a fifth contact hole CH5. As a result, the fifth source electrode SE5 may be connected to the power line PL through the first contact line CNL1 and the upper electrode UE of the storage capacitor Cst. One end of the fifth drain electrode DE5 may be connected to the fifth active pattern ACT5, and the other end of the fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode SE6 is connected to the light emitting control line Ei. The sixth gate electrode SE6 may be provided as a portion of the light emitting control line Ei or may be provided in a shape protruding from the light emitting control line Ei. The sixth active pattern ACT6, the sixth source electrode SE6, and the sixth drain electrode DE6 may be formed of a semiconductor layer undoped or doped with impurities. The sixth source electrode SE6 and the sixth drain electrode DE6 may be formed of a semiconductor layer doped with impurities, and the sixth active pattern ACT6 may be formed of a semiconductor layer undoped with impurities. The sixth active pattern ACT6 corresponds to a portion overlapping with the sixth gate electrode GE6. One end of the sixth source electrode SE6 may be connected to the sixth active pattern ACT6, and the other end of the sixth source electrode SE6 may be connected to the third source electrode SE3 of the third transistor T3. One end of the sixth drain electrode DE6 may be connected to the sixth active pattern ACT6, and the other end of the sixth drain electrode DE6 may be connected to a seventh source electrode SE7 of the seventh transistor T7.

The seventh transistor T7 may include a seventh gate electrode GE7, a seventh active pattern ACT7, the seventh source electrode SE7, and the seventh drain electrode DE7.

The seventh gate electrode GE7 is connected to the (i+1)th scan line Si+1. The seventh gate electrode GE7 may be provided as a portion of the (i+1)th scan line Si+1 or may be provided in a shape protruding from the (i+1)th scan line Si+1. The seventh active pattern ACT7, the seventh source electrode SE7, and the seventh drain electrode DE7 may be formed of a semiconductor layer undoped or doped with impurities. The seventh source electrode SE7 and the seventh drain electrode DE7 may be formed of a semiconductor layer doped with impurities, and the seventh active layer ACT7 may be formed of a semiconductor layer undoped with impurities. The seventh active pattern ACT7 corresponds to a portion overlapping with the seventh gate electrode GE7. One end of the seventh source electrode SE7 may be connected to the seventh active pattern ACT7, and the other end of the seventh source electrode SE7 may be connected to the sixth drain electrode DE6 of the sixth transistor T6. One end of the seventh drain electrode DE7 may be connected to the seventh active pattern ACT7, and the other end of the seventh drain electrode DE7 may be connected to the initialization power line IPL through the ninth contact hole CH9. Also, the seventh drain electrode DE7 may be connected to a fourth source electrode SE4 of a fourth transistor T4 of a pixel PXL on a next row.

The storage capacitor Cst may include a lower electrode LE and the upper electrode UE. The lower electrode LE may be formed as the first gate electrode GE1 of the first transistor T1. The upper electrode UE may overlap with the first gate electrode GE1, and cover the lower electrode LE when viewed on a plane. As the overlapping area of the upper electrode UE and the lower electrode LE is widened, the capacitance of the storage capacitor Cst may be increased. The upper electrode UE may extend in the first direction DR1. In an embodiment of the present disclosure, the upper electrode UE may be electrically connected to the power line PL through the fifth contact hole CH5. Therefore, a voltage having the same level as the first power source ELVDD applied to the power line PL may be applied to the upper electrode UE. The upper electrode UE may have an opening OPN in a region in which the first contact hole CH1 through which the first gate electrode GE1 and the second contact line CNL2 are contact in each other is formed.

The light emitting diode OLED may include the third anode electrode AD3, a cathode electrode CD, and an emitting layer EML provided between the third anode electrode AD3 and the cathode electrode CD.

The third anode electrode AD3 may be connected to the seventh source electrode SE7 of the seventh transistor T7 and the sixth drain electrode DE6 of the sixth transistor T6 through a seventh contact hole CH7 and an eighth contact hole CH8. A bridge pattern BRP may be provided between the seventh contact hole CH7 and the eighth contact hole CH8 to connect the third anode electrode AD3 to the sixth drain electrode DE6 and the seventh source electrode SE7.

Again, a structure of the display device according to the embodiment of the present disclosure will be described along a stacking order with reference to FIGS. 5 and 6.

First, the active patterns ACT1, ACT2, ACT3, ACT4, ACT5, ACT6, and ACT7 (hereinafter, referred to as the active patterns ACT1 to ACT7 or as the active patterns ACT) may be disposed on the first substrate SUB1. The active patterns ACT may include the first to seventh active patterns ACT1 to ACT7. The first to seventh active patterns ACT1 to ACT7 may include a semiconductor material.

A buffer layer (not shown) may be disposed between the first substrate SUB1 and the first to seventh active patterns ACT1 to ACT7.

A gate insulating layer GI may be disposed on the first substrate SUB1 on which the first to seventh active patterns ACT1 to ACT7 are formed.

The (i−1)th scan line Si−1, the ith scan line Si, the (i+1)th scan line Si+1, and the light emitting control line Ei may be provided on the gate insulating layer GI. In addition, the first, second, third, fourth, fifth, sixth, and seventh gate electrodes GE1, GE2, GE3, GE4 GE5, GE6, and GE7, sometimes called the first to seventh gate electrodes GE1 to GE7, may be provided on the gate insulating layer GI.

The first gate electrode GE1 may become the lower electrode LE of the storage capacitor Cst. The second gate electrode GE2 and the third gate electrode GE3 may be integrally formed with the ith scan line Si. The fourth gate electrode GE4 may be integrally formed with the (i−1)th scan line Si−1. The fifth gate electrode GE5 and the sixth gate electrode GE6 may be integrally formed with the light emitting control line Ei. The seventh gate electrode GE7 may be integrally formed with the (i+1)th scan line Si+1.

A first insulating layer IL1 may be disposed on the first substrate SUB1 on which the (i−1)th scan line Si−1 and the like are formed.

The upper electrode UE of the storage capacitor Cst may be disposed on the first insulating layer IL1. The upper electrode UE may cover the lower electrode LE. The upper electrode UE along with the lower electrode LE may constitute the storage capacitor Cst with the first insulating layer IL1 interposed therebetween.

A second insulating layer IL2 may be disposed on the first substrate SUB1 on which the upper electrode UE is formed.

The data line Dj, the power line PL, the first and second contact lines CNL1 and CNL2, the initialization power line IPL, and the bridge pattern BRP may be disposed on the second insulating layer IL2.

The data line Dj may be connected to the second source electrode SE2 through the sixth contact hole CH6 passing through the gate insulating layer GI and the first and second insulating layers IL1 and IL2.

The power line PL may be connected to the upper electrode UE of the storage capacitor Cst through the fifth contact hole CH5 passing through the second insulating layer IL2.

The initialization power line IPL may be connected to the fourth source electrode SE4 and the seventh drain electrode DE7 through the ninth contact hole CH9 passing through the first and second insulating layers IL1 and IL2 and the gate insulating layer GI.

The first contact line CNL1 may be connected to the fifth source electrode SE5 through the fourth contact hole CH4 passing through the gate insulating layer GI and the first and second insulating layers IL1 and IL2. Also, the first contact line CNL1 may be connected to the upper electrode UE through the third contact hole CH3 passing through the second insulating layer IL2. The fifth source electrode SE5 and the upper electrode UE may be electrically connected through the first contact line CNL1.

The second contact line CNL2 may be connected to the first gate electrode GE1 through the first contact hole CH1 passing through the first and second insulating layers IL1 and IL2. Also, the second contact line CNL2 may be connected to the third drain electrode DE3 and the fourth drain electrode DE4 through the second contact hole CH2 passing through the first and second insulating layers IL1 and IL2 and the gate insulating layer GI.

The bridge pattern BRP is a pattern provided as a medium connecting the sixth drain electrode DE6 to the third anode electrode AD3 between the sixth drain electrode DE6 and the third anode electrode AD3, and may be connected to the sixth drain electrode DE6 and the seventh source electrode SE7 through the seventh contact hole CH7 passing through the first and second insulating layers IL1 and IL2 and the gate insulating layer GI.

A protective layer PSV may be disposed on the first substrate SUB1 on which the data line Dj and the like are formed. The protective layer PSV may include any one of an organic insulating material and an inorganic insulating material. For example, in an embodiment of the present disclosure, the protective layer PSV may be an organic insulating material including an organic material.

The light emitting diode OLED may be disposed on the protective layer PSV. The light emitting diode OLED may include the third anode electrode AD3, the cathode electrode CD, and the emitting layer EML provided between the third anode electrode AD3 and the cathode electrode CD.

The third anode electrode AD3 may be disposed on the protective layer PSV. The third anode electrode AD3 may be connected to the bridge pattern BRP through the eighth contact hole CH8 passing through the protective layer PSV. Therefore, the third anode electrode AD3 may be electrically connected to the bridge pattern BRP. Since the bridge pattern BRP is connected to the sixth drain electrode DE6 and the seventh source electrode SE7 through the seventh contact hole CH7, the third anode electrode AD3 may be finally connected electrically to the sixth drain electrode DE6 and the seventh source electrode SE7.

A pixel defining layer PDL defining first, second, and third light emitting regions R, G, and B, sometimes called the first to third light emitting regions R, G, and B, may be disposed on the first substrate SUB1 on which the third anode electrode AD3 and the like are formed. The pixel defining layer PDL may expose a top surface of the third anode electrode AD3 and protrude from the first substrate SUB1 along the circumference of each of the first to third light emitting regions R, G, and B. The pixel defining layer PDL may include an organic insulating material.

The emitting layer EML may be provided to correspond to each of the first to third light emitting regions R, G, and B surrounded by the pixel defining layer PDL, and the cathode electrode CD may be disposed on the emitting layer EML. A filling layer FLL covering the cathode electrode CD may be disposed on the cathode electrode CD. The filling layer FLL may include an adhesive material.

The second substrate SUB2 may be disposed on the filling layer FLL. The second substrate SUB2 may be an encapsulation substrate that prevents oxygen and moisture from penetrating into the light emitting diode OLED. In this case, the second substrate SUB2 may be joined with the first substrate SUB1 through a sealant.

In an embodiment of the present disclosure, a case where the second substrate SUB2 as the encapsulation substrate is applied to isolate the light emitting diode OLED from an external environment has been described as an example, but the present disclosure is not limited thereto. For example, an encapsulation layer instead of the second substrate SUB2 may be applied to isolate the light emitting diode OLED from an external environment. The encapsulation layer may include a plurality of inorganic layers and a plurality of organic layers. For example, the encapsulation layer may include a plurality of unit encapsulation layers each including an inorganic layer and an organic layer disposed on the inorganic layer. In an embodiment of the present disclosure, when the light emitting diode OLED is isolated from an external environment using the second substrate SUB2 as the encapsulation substrate, the encapsulation layer may be omitted.

A reflective member RL may be disposed between the second substrate SUB2 and the filling layer FLL. The reflective member RL may allow the display device according to the embodiment of the present disclosure to serve as a mirror by reflecting light incident into the first substrate SUB1 from the outside.

Figure 7:
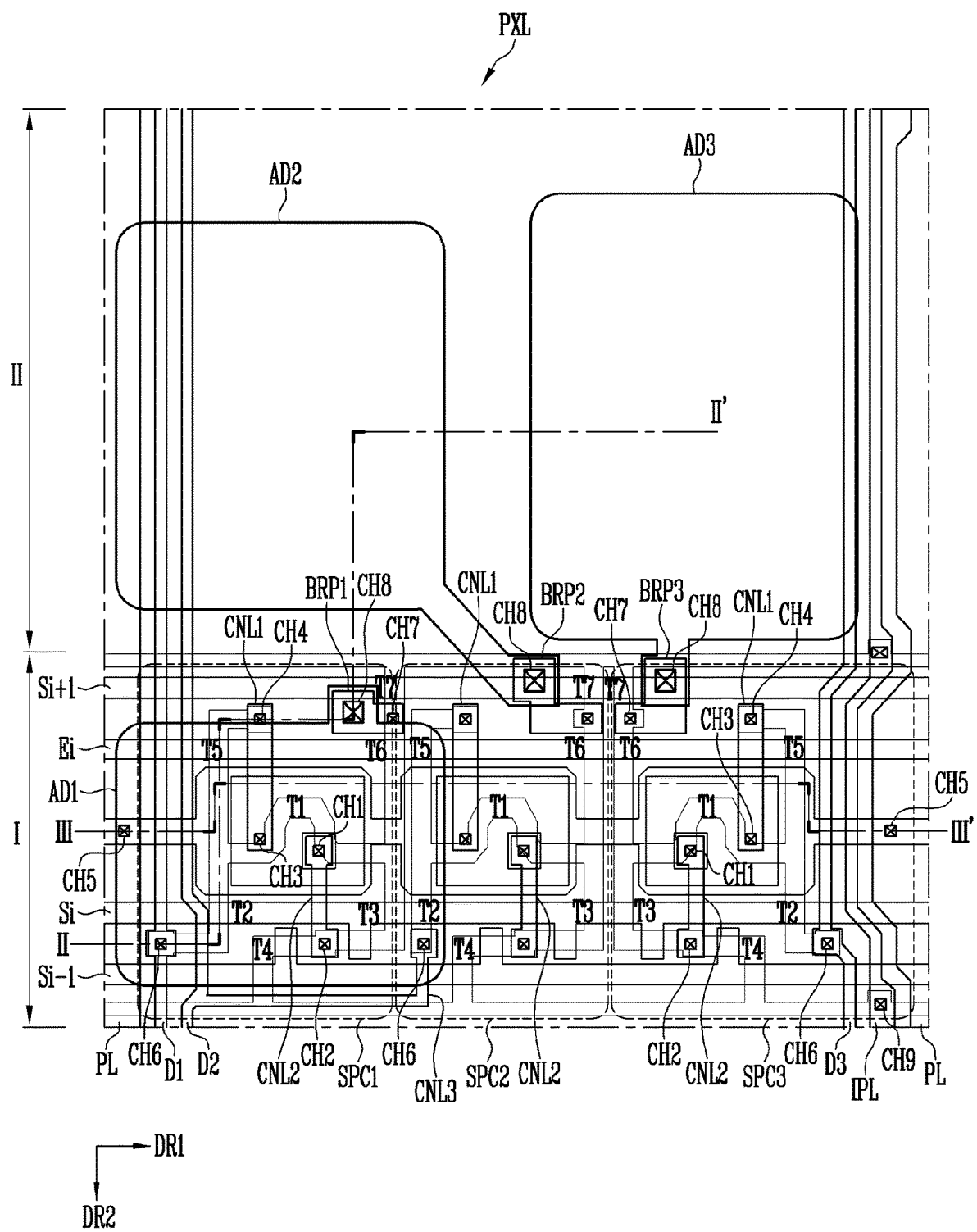
FIG. 7 is a plan view illustrating in detail the pixel shown in FIG. 3.
Figure 8:
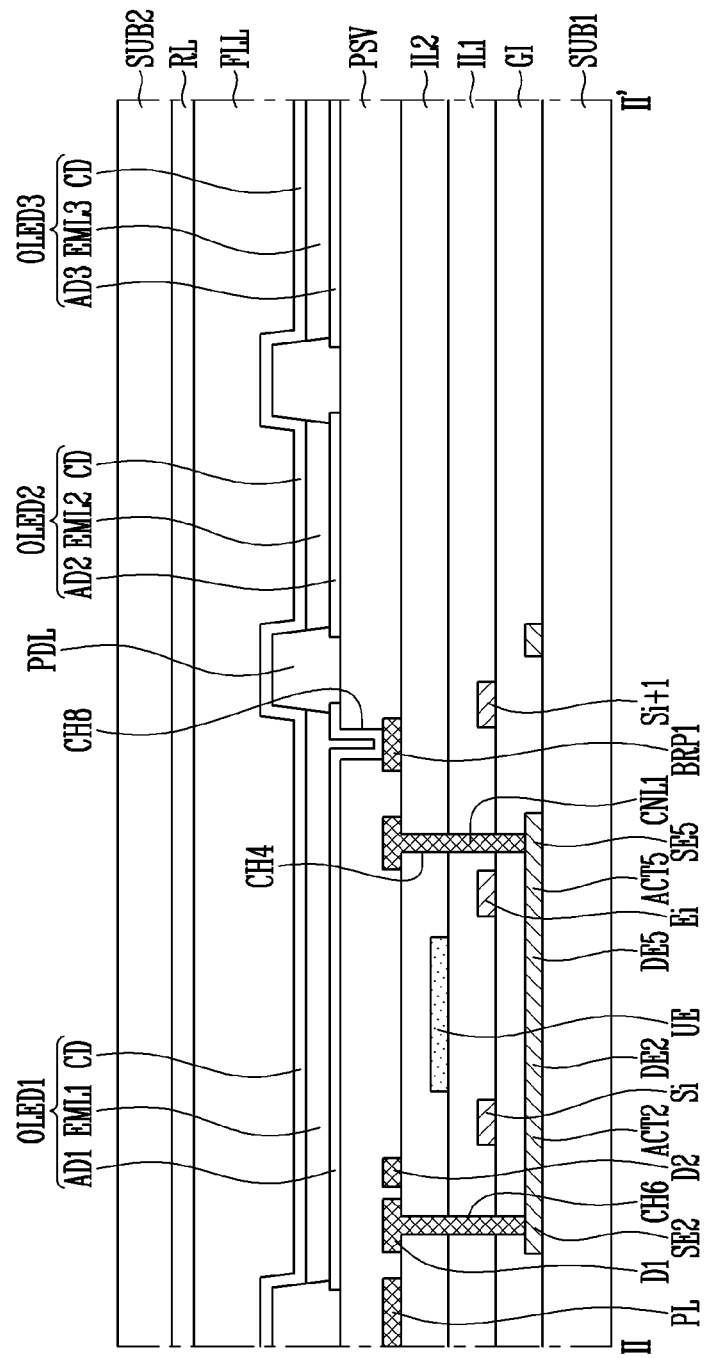
FIG. 8 is a sectional view taken along line II-IF of FIG. 7.
Figure 9:
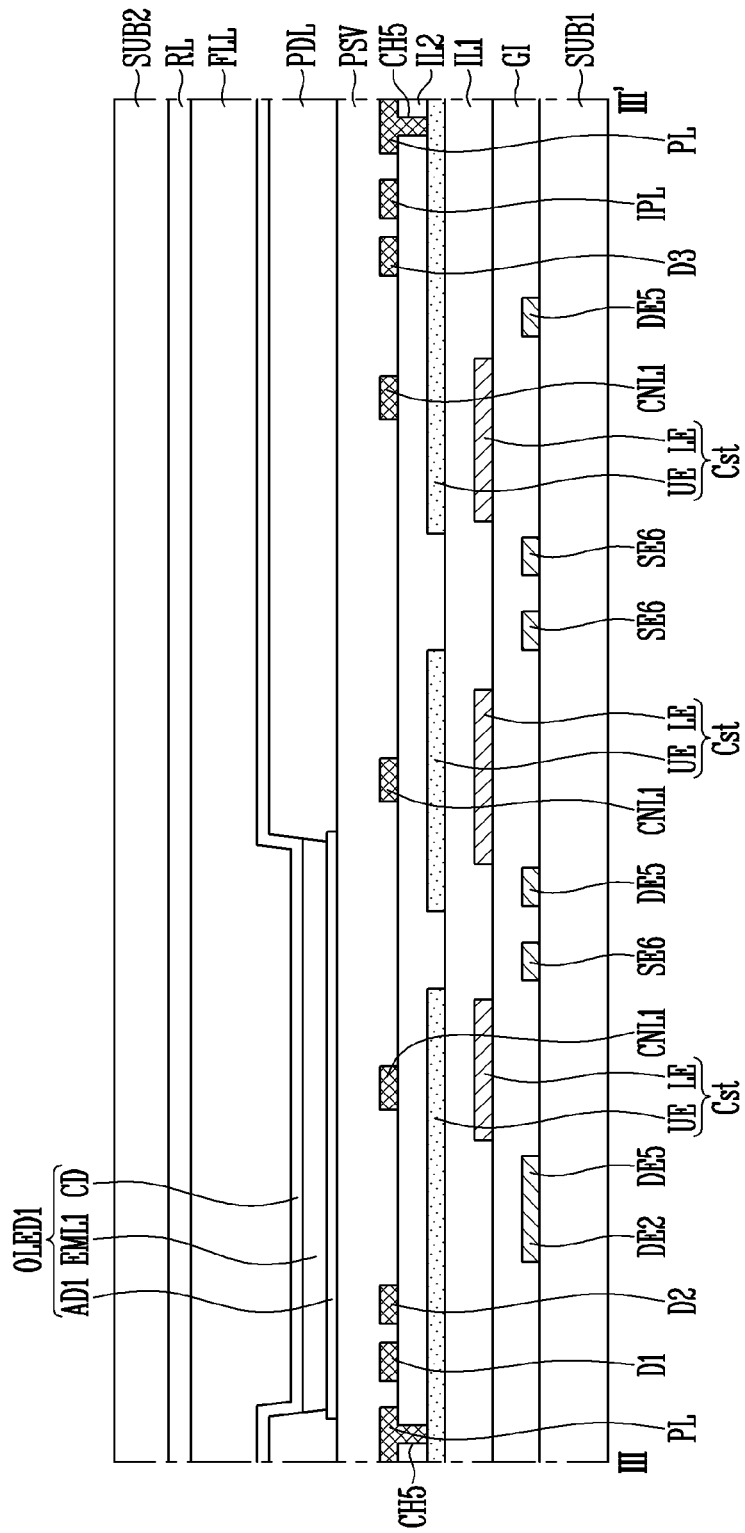
FIG. 9 is a sectional view taken along line III-III' of FIG. 7.

FIG. 7 is a plan view illustrating in detail the pixel shown in FIG. 3. FIG. 8 is a sectional view taken along line II-II' of FIG. 7. FIG. 9 is a sectional view taken along line III-III' of FIG. 7.

Based on one pixel PXL including first to third sub-pixels, three scan lines Si−1, Si, and Si+1, a light emitting control line Ei, a power line PL, an initialization power line IPL, and three data lines D1, D2, and D3, which are connected to the one pixel PXL, have been illustrated in FIGS. 7 to 9. In FIGS. 7 to 9, for convenience of description, a scan line on an (i−1)th row is referred to as an "(i−1)th scan line Si−1," a scan line on the ith row is referred to as an "ith scan line Si," a scan line on the (i+1)th row is referred to as an "(i+1)th scan line Si+1," a light emitting control line on the ith row is referred to as a "light emitting control line Ei," a data line connected to the first sub-pixel is referred to as a "first data line D1," a data line connected to the second sub-pixel is referred to as a "second data line D2," a data line connected to the third sub-pixel is referred to as a "third data line D3," and a power line and an initialization power line on a jth column is referred to as a "power line PL" and an "initialization power line IPL."

Also, in FIGS. 7 to 9, differences of first to seventh transistors provided in each of the three sub-pixels from those of the above-described embodiment will be mainly described to avoid redundancy, and portions not particularly described in the embodiment of the present disclosure follow those of the above-described embodiment. Like reference numerals designate like components, and similar reference numerals designate similar components. Also, in FIGS. 7 to 9, cathode electrodes provided in first to third light emitting devices correspond to a common layer entirely surrounding the one pixel PXL, and therefore, the same reference numeral is provided.

Referring to FIGS. 3 and 7 to 9, the display device according to the embodiment of the present disclosure includes first and second substrates SUB1 and SUB2, a line unit, and pixels PXL.

The line unit provides signals to each of the pixels PXL, and may include scan lines Si−1, Si, and Si+1, data lines D1, D2, and D3, a light emitting control line Ei, a power line PL, and an initialization power line IPL.

The scan lines Si−1, Si, and Si+1 extend in a first direction DR1 of the first substrate SUB1, and include an (i−1)th scan line Si−1, an ith scan line Si, and an (i+1)th scan line, which are sequentially arranged along a second direction DR2 intersecting the first direction DR1.

The light emitting control line Ei extends in the first direction DR1, and is disposed between the ith scan line Si and the (i+1)th scan line Si+1 to be spaced apart from the ith scan line Si and the (i+1)th scan line Si+1. A light emitting control signal is applied to the light emitting control line Ei.

The data lines D1, D2, and D3 extend in the second direction DR2, and includes a first data line D1, a second data line D2, and a third data line D3, which are sequentially arranged along the first direction DR1. A data signal is applied to the data lines D1, D2, and D3. A first data signal is applied to the first data line D1, a second data signal is applied to the second data line D2, and a third data signal is applied to the third data line D3.

The power line PL extends along the second direction DR2, and is disposed to be spaced apart from the data lines D1, D2, and D3. A first power source (see the first power source ELVDD of FIG. 2) may be applied to the power line PL.

The initialization power line IPL may be disposed between the third data line D3 and the power line PL, which extend along the second direction DR2. An initialization power source (see the initialization power source Vint of FIG. 2) may be applied to the initialization power line IPL.

Each pixel PXL may include first to third sub-pixels.

The first sub-pixel may include a first sub-pixel circuit SPC1 connected to the scan lines Si−1, Si, and Si+1 and the first data line D1 and a first light emitting diode OLED1 connected to the first sub-pixel circuit SPC1. The second sub-pixel may include a second sub-pixel circuit SPC2 connected to the scan lines Si−1, Si, and Si+1 and the second data line D2 and a second light emitting diode OLED2 connected to the second sub-pixel circuit SPC2. The third sub-pixel may include a third sub-pixel circuit SPC3 connected to the scan lines Si−1, Si, and Si+1 and the third data line D3 and a third light emitting diode OLED3 connected to the third sub-pixel circuit SPC3.

In addition, the first sub-pixel may include a first light emitting region R that emits red light, the second sub-pixel may include a second light emitting region G that emits green light, and the third sub-pixel may include a third light emitting region B that emits blue right. Here, the first light emitting diode OLED1 may include a first anode electrode AD1 corresponding to the first light emitting region R, second light emitting diode OLED2 may include a second anode electrode AD2 corresponding to the second light emitting region G, and the third light emitting diode OLED3 may include a third anode electrode AD3 corresponding to the third light emitting region B.

In addition, each of the pixels PXL may include a first region I and a second region II. The first to third sub-pixel circuits SPC1 to SPC3 and the first anode electrode AD1 may be disposed in the first region I, and the second and third anode electrodes AD2 and AD3 may be disposed in the second region II. That is, the first to third sub-pixel circuits SPC1 to SPC3 are not disposed in the second region II.

Each of the first to third sub-pixel circuits SPC1 to SPC3 may include first to seventh transistors T1 to T7 connected to the data lines D1, D2, and D3 corresponding to the scan lines Si−1, Si, and Si+1, a storage capacitor Cst, and bridge patterns BRP1, BRP2, and BRP3.

The first transistor T1 includes a first gate electrode (see the first gate electrode GE1 of FIG. 5), a first active pattern (see the first active pattern ACT1 of FIG. 5), a first source electrode (see the first source electrode SE1 of FIG. 5), and a first drain electrode (see the first drain electrode DE1 of FIG. 5). The second transistor T2 includes a second gate electrode (see the second gate electrode GE2 of FIG. 5), a second active pattern (see the second active pattern ACT2 of FIG. 5), a second source electrode (see the second source electrode SE2 of FIG. 5), and a second drain electrode (see the second drain electrode DE2 of FIG. 5). The third transistor T3 includes a third gate electrode (see the third gate electrode GE3 of FIG. 5), a third active pattern (see the third active pattern ACT3 of FIG. 5), a third source electrode (see the third source electrode SE3 of FIG. 5), and a third drain electrode (see the third drain electrode DE3 of FIG. 5). The fourth transistor T4 includes a fourth gate electrode (see the fourth gate electrode GE4 of FIG. 5), a fourth active pattern (see the fourth active pattern ACT4 of FIG. 5), a fourth source electrode (see the fourth source electrode SE4 of FIG. 5), and a fourth drain electrode (see the fourth drain electrode DE4 of FIG. 5). The fifth transistor T5 includes a fifth gate electrode (see the fifth gate electrode GE5 of FIG. 5), a fifth active pattern (see the fifth active pattern ACT5 of FIG. 5), a fifth source electrode (see the fifth source electrode SE5 of FIG. 5), and a fifth drain electrode (see the fifth drain electrode DE5 of FIG. 5). The sixth transistor T6 includes a sixth gate electrode (see the sixth gate electrode GE6 of FIG. 5), a sixth active pattern (see the sixth active pattern ACT6 of FIG. 5), a sixth source electrode (see the sixth source electrode SE6 of FIG. 5), and a sixth drain electrode (see the sixth drain electrode DE6 of FIG. 5). The seventh transistor T7 includes a seventh gate electrode (see the seventh gate electrode GE7 of FIG. 5), a seventh active pattern (see the seventh active pattern ACT7 of FIG. 5), a seventh source electrode (see the seventh source electrode SE7 of FIG. 5), and a seventh drain electrode (see the seventh drain electrode DE7 of FIG. 5).

The storage capacitor Cst provided in each of the first to third sub-pixel circuits SPC1 to SPC3 may include a lower electrode LE and an upper electrode UE.

The gate electrode GE1 provided in each of the first to third sub-pixel circuits SPC1 to SPC3 may be connected to the third drain electrode DE3 and the fourth drain electrode DE4 through a second contact line CNL2. In addition, the fifth source electrode SE5 provided in each of the first to third sub-pixel circuits SPC1 to SPC3 may be connected to the upper electrode UE of the storage capacitor Cst and the power line PL through a first contact line CNL1.

In addition, the sixth drain electrode DE6 and the seventh source electrode SE7 provided in the first to third sub-pixel circuits SPC1 to SPC3 may be connected to corresponding anode electrodes AD1, AD2, and AD3 through the bridge patterns BRP1, BRP2, and BRP3 provided in the first to third sub-pixel circuits SPC1 to SPC3, respectively. Specifically, the sixth drain electrode DE6 and the seventh source electrode SE7 of the first sub-pixel circuit SPC1 may be connected to the first anode electrode AD1 through the first bridge pattern BRP1 of the first sub-pixel circuit SPC1. The sixth drain electrode DE6 and the seventh source electrode SE7 of the second sub-pixel circuit SPC2 may be connected to the second anode electrode AD2 through the second bridge pattern BRP2 of the second sub-pixel circuit SPC2. The sixth drain electrode DE6 and the seventh source electrode SE7 of the third sub-pixel circuit SPC3 may be connected to the third anode electrode AD3 through the third bridge pattern BRP3 of the third sub-pixel circuit SPC3.

The first anode electrode AD1 overlaps with the first sub-pixel circuit SPC1 in the first region I and may be connected to the first transistor T1 of the first sub-pixel circuit SPC1 via the sixth transistor T6 of the first sub-pixel circuit SPC1. The second anode electrode AD2 is disposed in the second region II and may be connected to the first transistor T1 of the second sub-pixel circuit SPC2 via the sixth transistor T6 of the second sub-pixel circuit SPC2. The third anode electrode AD3 is disposed in the second region II and may be connected to the first transistor T1 of the third sub-pixel circuit SPC3 via the sixth transistor T6 of the third sub-pixel circuit SPC3.

Meanwhile, when viewed on a plane, the first anode electrode AD1 disposed in the first region I may cover the first sub-pixel circuit SPC1. The second and third anode electrodes AD2 and AD3 may be disposed in the second region II in which the first to third sub-pixel circuits SPC1 to SPC3 are not disposed.

As described above, if only the second and third anode electrodes AD2 and AD3 except the first anode electrode AD1 are disposed in the second region II, effective areas of the second and third anode electrodes AD2 and AD3 can be further secured. In this case, an effective area of the second light emitting region G corresponding to the second anode electrode AD2 and an effective area of the third light emitting region B corresponding to the third anode electrode AD3 can also be secured.

In addition, as the first to third sub-pixel circuits SPC1 to SPC3 are intensively disposed in a specific region of the pixel PXL, e.g., in the first region I, an aperture ratio of the pixel can be secured, and accordingly, the light transmittance of the pixel PXL is increased, thereby improving image quality.

Again, a structure of the display device according to the embodiment of the present disclosure will be described along a stacking order with reference to FIGS. 7 to 9.

First, the active patterns ACT1 to ACT7 (hereinafter, referred to as the active patterns ACT) may be disposed on the first substrate SUB1. The active patterns ACT may include the first to seventh active patterns ACT1 to ACT7.

A gate insulating layer GI may be disposed on the active patterns ACT.

The (i−1)th scan line Si−1, the ith scan line Si, the (i+1)th scan line Si+1, and the light emitting control line Ei may be disposed on the gate insulating layer GI. In addition, the first to seventh gate electrodes GE1 to GE7 may be disposed on the gate insulating layer GI. The first gate electrode GE1 may become the lower electrode LE of the storage capacitor Cst of each of the first to third sub-pixel circuits SPC1 to SPC3.

A first insulating layer IL1 may be disposed on the first substrate SUB1 on which the (i−1)th scan line Si−1 and the like are formed.

The upper electrode UE of the storage capacitor Cst is disposed on the first insulating layer IL1. The upper electrode UE may cover the lower electrode LE. The upper electrode UE along with the lower electrode LE may constitute the storage capacitor Cst with the first insulating layer IL1 interposed therebetween.

A second insulating layer IL2 may be disposed on the first substrate SUB1 on which the upper electrode UE is formed.

The first to third data lines D1, D2, and D3, the power line PL, the first and second contact lines CNL1 and CNL2, the initialization power source IPL, and the first to third bridge patterns BRP1, BRP2, and BRP3 may be disposed on the second insulating layer IL2. In addition, a third contact line CNL3 may be disposed on the second insulating layer IL2.

The first data line D1 may be connected to the second source electrode SE2 of the first sub-pixel circuit SPC1 through a sixth contact hole CH6 passing through the gate insulating layer GI and the first and second insulating layers IL1 and IL2.

The second data line D2 may be connected to the second source electrode SE2 of the second sub-pixel circuit SPC2 through the third contact line CNL3 and a sixth contact hole CH6 of the second sub-pixel circuit SPC2. Since the third contact line CNL3 is disposed between the second data line D2 and the second source electrode SE2, the third contact line CNL3 may extend along the first direction DR1 from the second data line D2 and be connected to the second source electrode SE2 of the second sub-pixel circuit SPC2 through the sixth contact hole CH6 passing through the first and second insulating layers IL1 and IL2 and the gate insulating layer GI. Therefore, the second data line D2 may be connected to the second source electrode SE2 of the second sub-pixel circuit SPC2.

The third data line D3 may be connected to the second source electrode SE2 of the third sub-pixel circuit SPC3 through a sixth contact hole CH6 of the third sub-pixel circuit SPC3, which passes through the gate insulating layer GI and the first and second insulating layers IL1 and IL2.

The power line PL may be connected to the upper electrode of the storage capacitor Cst of each of the first and third sub-pixel circuits SPC1 and SPC3 through a fifth contact hole CH5 passing through the second insulating layer IL2.

The initialization power line IPL may be connected to the fourth source electrode SE4 and the seventh drain electrode DE7, which are provided in each of the first to third sub-pixel circuits SPC1 to SPC3 through a ninth contact hole CH9 passing through the first and second insulating layers IL1 and IL2 and the gate insulating layer GI.

The first contact line CNL1 may be connected to the fifth source electrode SE6 provided in each of the first to third sub-pixel circuits SPC1, SPC2, and SPC3 through a fourth contact hole CH4 passing through the gate insulating layer GI and the first and second insulating layers IL1 and IL2. Also, the first contact line CNL1 may be connected to the upper electrode UE provided in each of the first to third sub-pixel circuits SPC1, SPC2, and SPC3 through a third contact hole CH3 passing through the second insulating layer IL2. The fifth source electrode SE5 provided in each of the first to third sub-pixel circuits SPC1, SPC2, and SPC3 and the upper electrode UE provided in each of the first to third sub-pixel circuits SPC1, SPC2, and SPC3 may be electrically connected through the first contact line CNL1.

The second contact line CNL2 may be connected to the first gate electrode GE1 provided in each of the first to third sub-pixel circuits SPC1, SPC2, and SPC3 through a first contact hole CH1 passing through the first and second insulating layers IL1 and IL2. Also, the second contact line CNL2 may be connected to the third drain electrode DE3 and the fourth drain electrode DE4, which are provided in each of the first to third sub-pixel circuits SPC1, SPC2, and SPC3 through a second contact hole CH2 passing through the first and second insulating layers IL1 and IL2 and the gate insulating layer GI.

The first bridge pattern BRP1 may be a pattern provided as a medium connecting the sixth drain electrode DE6 of the first sub-pixel circuit SPC1 and the first anode electrode AD1 between the sixth drain electrode DE6 and the first anode electrode AD1. The first bridge pattern BRP1 may be connected to the sixth drain electrode DE6 and the seventh source electrode SE7 through a seventh contact hole CH7 passing through the first and second insulating layers IL1 and IL2 and the gate insulating layer GI.

The second bridge pattern BRP2 may be a pattern provided as a medium connecting the sixth drain electrode DE6 of the second sub-pixel circuit SPC2 and the second anode electrode AD2 between the sixth drain electrode DE6 and the second anode electrode AD2. The second bridge pattern BRP2 may be connected to the sixth drain electrode DE6 and the seventh source electrode SE7 through a seventh contact hole CH7 passing through the first and second insulating layers IL1 and IL2 and the gate insulating layer GI.

The third bridge pattern BRP3 may be a pattern provided as a medium connecting the sixth drain electrode DE6 of the third sub-pixel circuit SPC3 and the third anode electrode AD3 between the sixth drain electrode DE6 and the third anode electrode AD3. The third bridge pattern BRP3 may be connected to the sixth drain electrode DE6 and the seventh source electrode SE7 through a seventh contact hole CH7 passing through the first and second insulating layers IL1 and IL2 and the gate insulating layer GI.

A protective layer PSV may be disposed on the first substrate SUB1 on which the first to third data lines D1, D2, and D3 and the like are formed. The protective layer PSV may include any one of an organic insulating material and an inorganic insulating material. For example, in an embodiment of the present disclosure, the protective layer PSV may include an organic insulating material including an organic material. Particularly, the protective layer PSV may include an organic insulating material capable of reducing and planarizing surfaces of the second insulating layer IL2, which are curved due to step differences between components disposed thereunder, e.g., the first to seventh transistors T1 to T7. The organic material may include a polyacryl-based compound, a polyimide-based compound, a fluorine-based compound such as Teflon, a benzocyclobutene-based compound, and the like.

The first to third light emitting diodes OLED1, OLED2, and OLED3 respectively connected to the first to third sub-pixel circuits SPC1, SPC2, and SPC3 may be provided on the protective layer PSV.

The first light emitting diode OLED1 may include the first anode electrode AD1, a cathode electrode CD, and a first emitting layer EML1 disposed between the first anode electrode AD1 and the cathode electrode CD. The first anode electrode AD1 may be connected to the first bridge pattern BRP1 through an eighth contact hole CH8 passing through the protective layer PSV. Since the first bridge pattern BRP1 is connected to the sixth drain electrode DE6 and the seventh source electrode SE7 through the seventh contact hole CH7, the first anode electrode AD1 may be finally connected to the sixth drain electrode DE6 and the seventh source electrode SE7.

The second light emitting diode OLED2 includes the second anode electrode AD2, the cathode electrode CD, and a second emitting layer EML2 disposed between the second anode electrode AD2 and the cathode electrode CD. The second anode electrode AD2 may be connected to the second bridge pattern BRP2 through an eighth contact hole CH8 passing through the protective layer PSV. Since the second bridge pattern BRP2 is connected to the sixth drain electrode DE6 and the seventh source electrode SE7 through the seventh contact hole CH7, the second anode electrode AD2 may be finally connected to the sixth drain electrode DE6 and the seventh source electrode SE7. In an embodiment of the present disclosure, it has been illustrated that the eighth contact hole CH8 electrically connecting the second bridge pattern BRP2 and the second anode electrode AD2 therethrough is disposed in the first region I, but the present disclosure is not limited thereto. For example, the eighth contact hole CH8 may be disposed between the first and second regions I and II or be disposed in only the second region II within a range in which electrical insulation of the second anode electrode AD2 from the first and third anode electrodes AD1 and AD3 is ensured.

The third light emitting diode OLED3 includes the third anode electrode AD3, the cathode electrode CD, and a third emitting layer EML3 disposed between the third anode electrode AD3 and the cathode electrode CD. The third anode electrode AD3 may be connected to the third bridge pattern BRP3 through an eighth contact hole CH8 passing through the protective layer PSV. Since the third bridge pattern BRP3 is connected to the sixth drain electrode DE6 and the seventh source electrode SE7 through the seventh contact hole CH7, the third anode electrode AD3 may be finally connected to the sixth drain electrode DE6 and the seventh source electrode SE7. In an embodiment of the present disclosure, it has been illustrated that the eighth contact hole CH8 electrically connecting the third bridge pattern BRP3 and the third anode electrode AD3 therethrough is disposed in the first region I, but the present disclosure is not limited thereto. For example, the eighth contact hole CH8 may be disposed between the first and second regions I and II or be disposed in only the second region II within a range in which electrical insulation of the third anode electrode AD3 from the first and second anode electrodes AD1 and AD2 is ensured.

Each of the first to third anode electrodes AD1 to AD3 may include a reflective layer (not shown) capable of reflecting light, and a transparent conductive layer (not shown) disposed on the top or bottom of the reflective layer. At least one of the transparent conductive layer and the reflective layer may be connected to the sixth drain electrode DE6 and the seventh source electrode SE7 of a corresponding sub-pixel circuit.

The reflective layer may include a material capable of reflecting light. For example, the reflective layer may include at least one selected from the group consisting of aluminum (Al), silver (Ag), chromium (Cr), molybdenum (Mo), platinum (Pt), nickel (Ni), and alloys thereof.

The transparent conductive layer may include a transparent conductive oxide. For example, the transparent conductive layer may include at least one transparent conductive oxide selected from indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

A pixel defining layer PDL defining the first to third light emitting regions R, G, and B may be disposed on the first substrate SUB1 on which the first to third anode electrodes AD1, AD2, and AD3 and the like are disposed. The pixel defining layer PDL may expose a top surface of each of the first to third anode electrodes AD1, AD2, and AD3, and protrude from the first substrate SUB1 along the circumference of the first to third light emitting regions R, G, and B.

The pixel defining layer PDL may include an organic insulating material. For example, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane-based resin, and silane-based resin. Also, the pixel defining layer PDL may be a black pixel defining layer made of a thermosetting resin including a black pigment, etc. In this case, although light incident from the outside causes diffused reflection in the first to third sub-pixel circuits SPC1 to SPC3, the light is absorbed by the pixel defining layer PDL. Therefore, the light may have no influence on components provided on the pixel defining layer PDL.

The first to third light emitting layers EML1, EML2, and the EML3 may be disposed in the first to third light emitting regions R, G, and B surrounded by the pixel defining layer PDL, respectively. The cathode electrode CD may be disposed on the first to third emitting layers EML1, EML2, and EML3.

The first emitting layer EML1 may be disposed on the exposed surface of the first anode electrode AD1. The first emitting layer EML1 may have a multi-layered thin film structure including a light generation layer (LGL) that generates red light. For example, the first emitting layer EML1 may include a hole injection layer (HIL) for injecting holes, a hole transport layer (HTL) having an excellent hole transporting property, the HTL for increasing the opportunity for holes and electrons to be re-combined by suppressing the movement of electrons that fail to be combined in the LGL, the LGL for emitting light through the re-combination of the injected electrons and holes, a hole blocking layer (HBL) for suppressing the movement of holes that fail to be combined in the LGL, an electron transport layer (ETL) smoothly transporting electrons to the LGL, and an electron injection layer (EIL) for injecting electrons.

The second emitting layer EML2 may be disposed on the exposed surface of the second anode electrode AD2. The second emitting layer EML2 may have a multi-layered thin film structure including a light generation layer (LGL) that generates green light. For example, the second emitting layer EML2 may include a hole injection layer (HIL) for injecting holes, a hole transport layer (HTL) having an excellent hole transporting property, the HTL for increasing the opportunity for holes and electrons to be re-combined by suppressing the movement of electrons that fail to be combined in the LGL, the LGL for emitting light through the re-combination of the injected electrons and holes, a hole blocking layer (HBL) for suppressing the movement of holes that fail to be combined in the LGL, an electron transport layer (ETL) smoothly transporting electrons to the LGL, and an electron injection layer (EIL) for injecting electrons.

The third emitting layer EML3 may be disposed on the exposed surface of the third anode electrode AD3. The third emitting layer EML3 may have a multi-layered thin film structure including a light generation layer (LGL) that generates blue light. For example, the third emitting layer EML3 may include a hole injection layer (HIL) for injecting holes, a hole transport layer (HTL) having an excellent hole transporting property, the HTL for increasing the opportunity for holes and electrons to be re-combined by suppressing the movement of electrons that fail to be combined in the LGL, the LGL for emitting light through the re-combination of the injected electrons and holes, a hole blocking layer (HBL) for suppressing the movement of holes that fail to be combined in the LGL, an electron transport layer (ETL) smoothly transporting electrons to the LGL, and an electron injection layer (EIL) for injecting electrons.

A filling layer FLL covering the cathode electrode CD may be disposed on the cathode electrode CD. The filling layer FLL may be made of an insulating material and include an adhesive material for allowing the second substrate SUB2 to be adhered to the first substrate SUB1.

The second substrate SUB may be disposed on the filling layer FLL. The second substrate SUB2 may be an encapsulation substrate for preventing oxygen and moisture from penetrating into the first to third light emitting diodes OLED1 to OLED3. In this case, the second substrate may be joined with the first substrate SUB1 through a sealant.

In an embodiment of the present disclosure, a case where the second substrate SUB2 as an encapsulation substrate is applied to isolate the first to third light emitting diodes OLED1, OLED2, and OLED3 from an external environment has been described as an example, but the present disclosure is not limited thereto. For example, instead of the second substrate SUB2, an encapsulation layer may be applied to isolate the first to third light emitting diodes OLED1, OLED2, and OLED3 from an external environment. The encapsulation layer may include a plurality of inorganic layers and a plurality of organic layers. For example, the encapsulation layer may include a plurality of unit encapsulation layer each including an inorganic layer and an organic layer disposed on the inorganic layer. In an embodiment of the present disclosure, when the light emitting diode OLED is isolated from an external environment using the second substrate SUB2 as the encapsulation substrate, the encapsulation layer may be omitted.

Meanwhile, the display device according to the above-described embodiment may include a reflective member RL to serve as a mirror capable of being used by a user if necessary.

The reflective member RL may be disposed between the second substrate SUB2 and the filling layer FLL. The reflective member RL reflects light incident from the outside in a mode in which the display device does not display any image, so that the display device can serve as a mirror.

The reflective member RL may include a metallic material having a constant reflexability and specular reflection characteristics. For example, the reflective member RL may include gold (Au), silver (Ag), aluminum (Al), magnesium (Mg), platinum (Pt), nickel (Ni), titanium (Ti), and the like. Also, the reflective member RL may include any alloy containing aluminum, aluminum nitride (AlNx), any alloy containing silver, tungsten nitride (WNx), any alloy containing copper, chromium nitride (CrNx), any alloy containing molybdenum, titanium nitride (TiNx), tantalum nitride (TaNx), strontium ruthenium oxide (SRO), zinc oxide (ZnOx), tin oxide (SnOx), indium oxide (InOx), gallium oxide (GaOx), and the like.

The reflective member RL may be disposed under the second substrate SUB2 to cover both of the first and second regions I and II of each pixel PXL. At this time, the first to third sub-pixel circuits SPC1, SPC2, and SPC3 are not disposed in the second regions II, but only the second and third anode electrodes AD2 and AD3 are disposed on the second region II. Since the first to third sub-pixel circuits SPC1, SPC2, and SPC3 are not disposed in the second region II, the second region II may be a flat region that is not influenced by step differences generated by the first to third sub-pixel circuits SPC1, SPC2, and SPC3. The reflective member RL provided at an upper portion of the second region II as the flat region may have specular reflection characteristics that light is clearly reflected like a mirror when the display device serves as the mirror.

In the display device according to the above-described embodiment, as the first to third sub-pixel circuits SPC1, SPC2, and SPC3 are intensively disposed in the first region I of each pixel PXL, the aperture ratio of the pixel PXL, thereby improving image quality.

Further, in the display device according to the above-described embodiment, as only the second and third anode electrodes AD2 and AD3 are disposed in the second region II of each pixel PXL, effective areas of the second and third anode electrodes AD2 and AD3 are secured, thereby enlarging the second and third light emitting regions G and B.

Further, in the display device according to the above-described embodiment, as the second region II is implemented as a flat region, light incident from the outside does not cause diffused reflection in the second region II but is constantly reflected, thereby serving as a clear mirror.

FIGS. 10 to 14 are layout views schematically illustrating components of the pixel shown in FIG. 7 for each layer.

Figure 10:
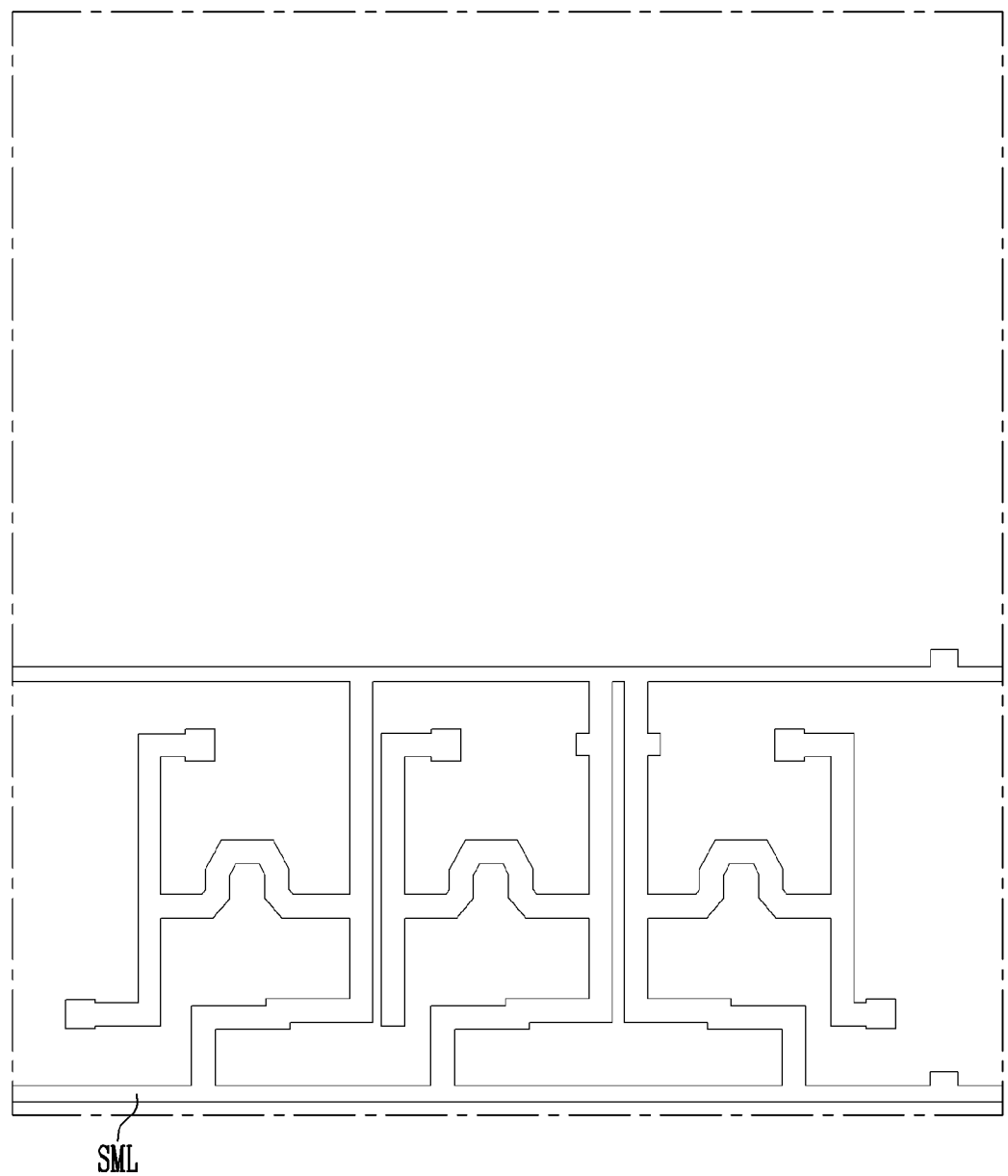
FIGS. 10, 11, 12, 13, and 14 are layout views schematically illustrating components of the pixel shown in FIG. 7 for each layer.

First, referring to FIGS. 7 and 10, a semiconductor layer SML including first to seventh active patterns (see the first to seventh active patterns ACT1 to ACT7 of FIG. 5) may be disposed on a first substrate (see the first substrate SUB1 of FIG. 8). The first to seventh active patterns ACT1 to ACT7 may be disposed in the same layer and be formed through the same process.

Figure 11:
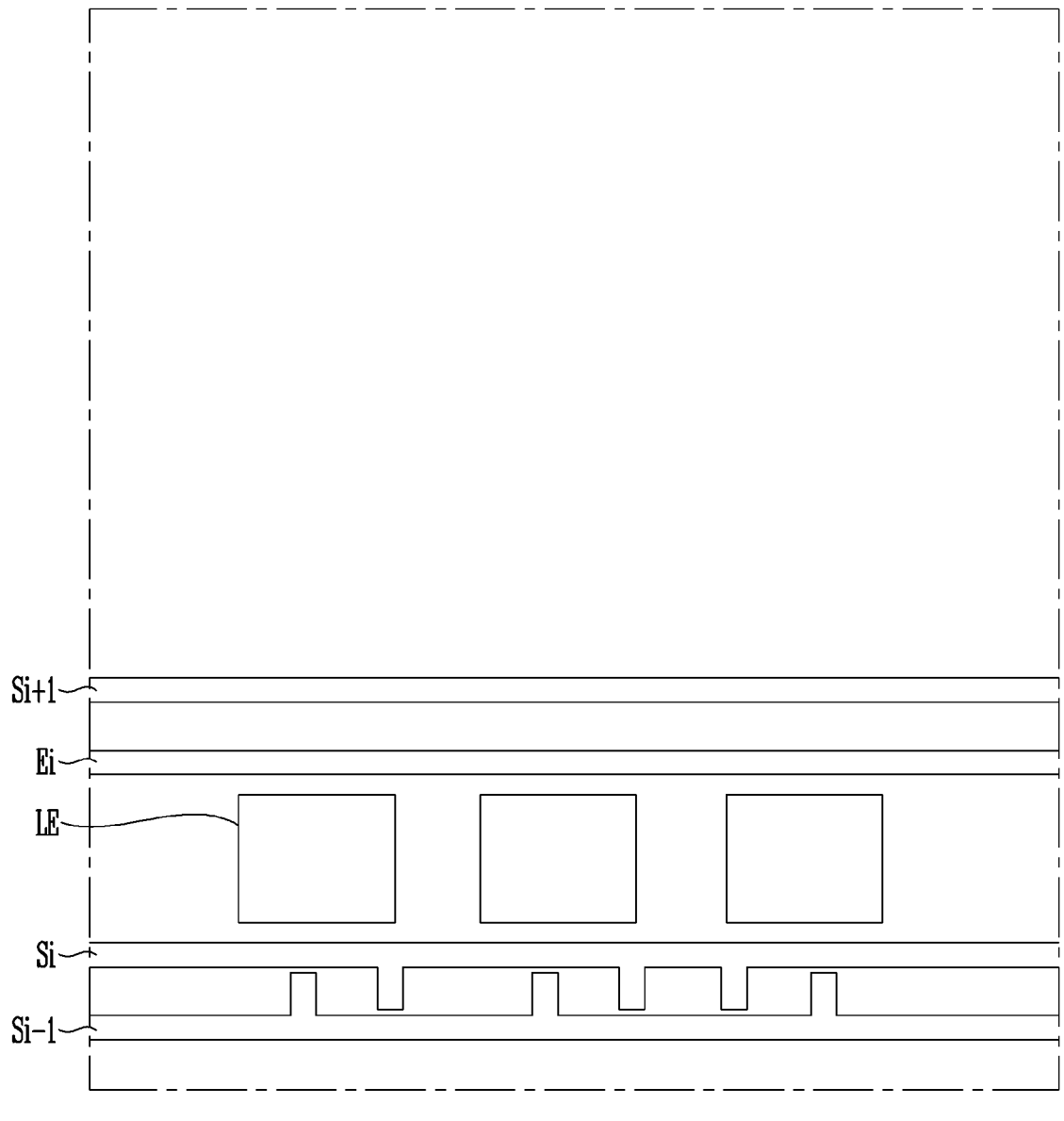

Referring to FIGS. 7 and 11, scan lines Si−1, Si, and Si+1, a light emitting control line Ei, and a lower electrode LE may be disposed on the first to seventh active patterns ACT1 to ACT7 with a gate insulating layer (see the gate insulating layer GI of FIG. 8) interposed therebetween. The scan lines Si−1, Si, and Si+1, the light emitting control line Ei, and the lower electrode LE may be disposed in the same layer and be formed through the same process.

Figure 12:
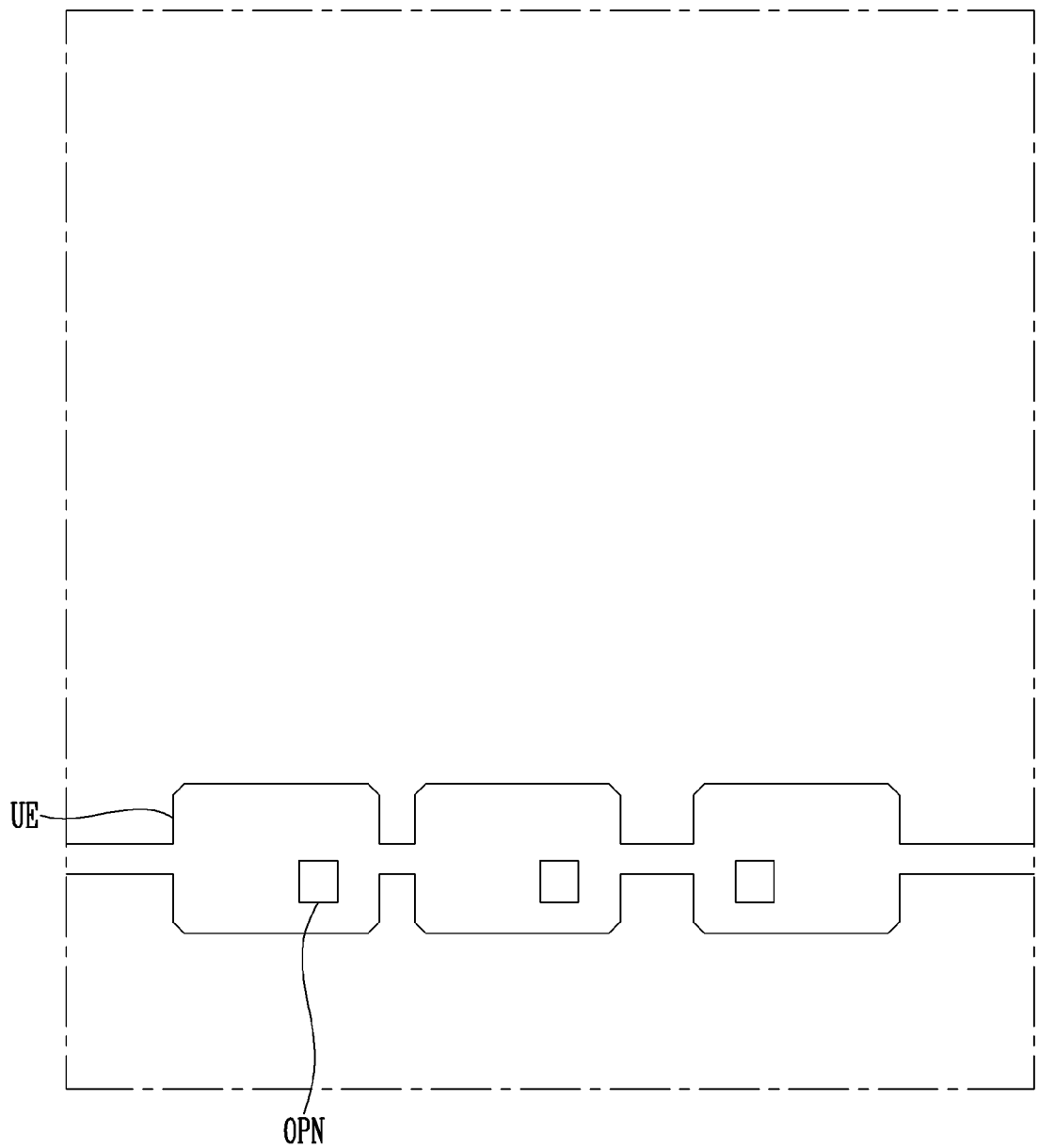

Referring to FIGS. 7 and 12, an upper electrode UE may be disposed on the scan lines (see the scan lines Si−1, Si, and Si+1 of FIG. 11), the light emitting control line (see the light emitting control line Ei of FIG. 11), and the lower electrode (see the lower electrode LE of FIG. 11) with a first insulating layer (see the first insulating layer IL1 of FIG. 8). The upper electrode UE may overlap with the lower electrode LE. When viewed on a plane, the upper electrode UE may cover the lower electrode LE. The upper electrode UE along with the lower electrode LE may constitute a storage capacitor Cst with the first insulating layer IL1 interposed therebetween.

Figure 13:
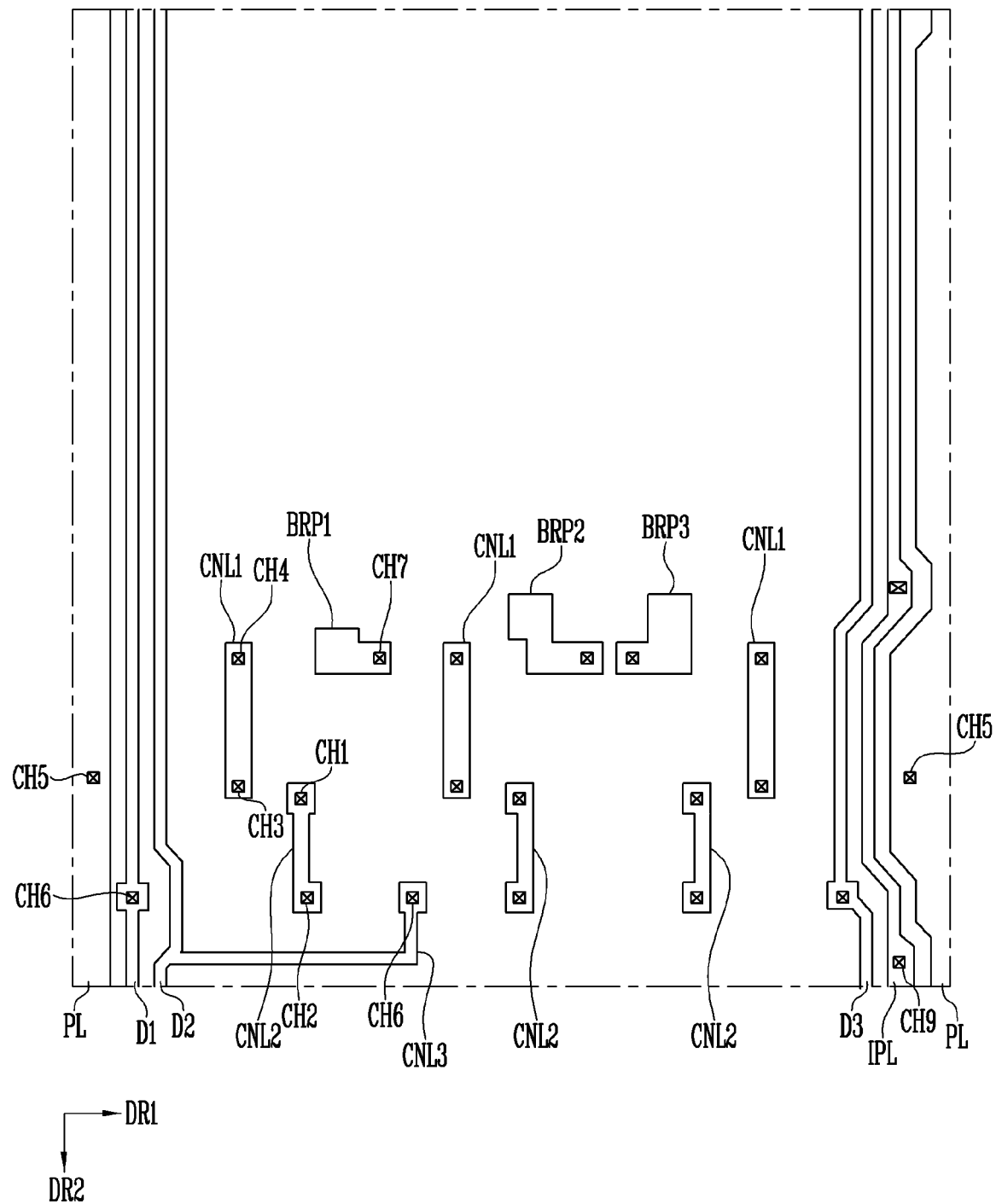

Referring to FIGS. 7 and 13, first to third data lines D1, D2, and D3, a power line PL, an initialization power line IPL, first to third bridge patterns BRP1, BRP2, and BRP3, and first to third contact lines CNL1, CNL2, and CNL3 may be disposed on the upper electrode (see the upper electrode UE of FIG. 12) with a second insulating layer (see the second insulating layer IL2 of FIG. 8) interposed therebetween.

Figure 14:
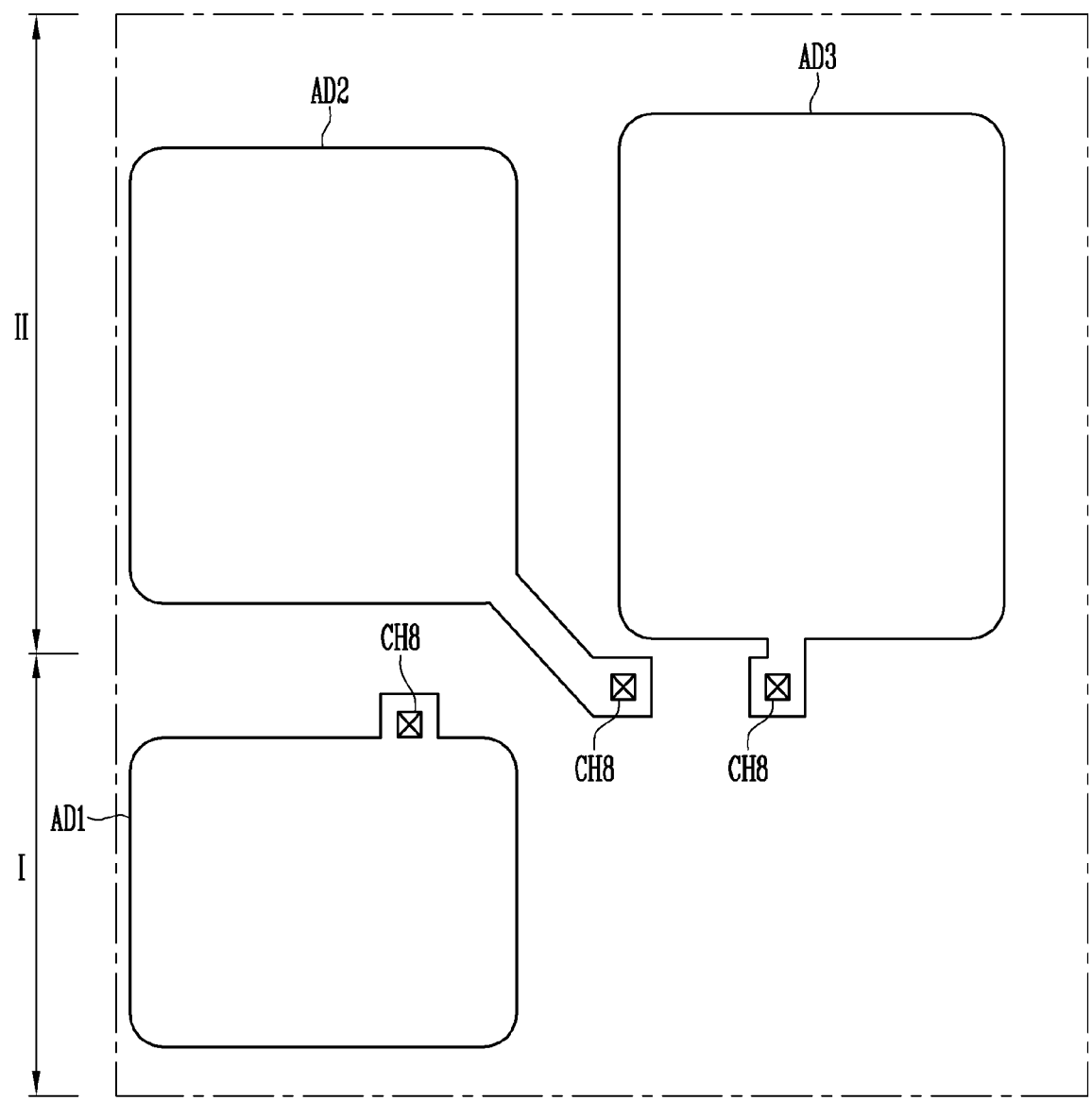

Referring to FIGS. 7 and 14, first to third anode electrodes AD1, AD2, and AD3 may be disposed on the first to third data lines (see D1, D2, and D3 of FIG. 13), the first to third contact lines (see the first to third contact lines CNL1, CNL2, and CNL3 of FIG. 13), and the first to third bridge patterns (see the first to third bridge patterns BRP1, BRP2, and BRP3 of FIG. 13) with a protective layer (see the protective layer PSV of FIG. 8) interposed therebetween.

The first anode electrode AD1 may be disposed in a first region I of each pixel PXL, and be connected to the first bridge pattern BRP1 through an eighth contact hole CH8 passing through the protective layer PSV. When viewed on a plane, the first anode electrode AD1 may overlap with first to seventh transistors (see the first to seventh transistors T1 to T7 of FIG. 7) provided in a first sub-pixel circuit (see the first sub-pixel circuit SPC1 of FIG. 7) and cover the first to seventh transistors T1 to T7.

The second anode electrode AD2 may be disposed in a second region II of each pixel PXL, and be connected to the second bridge pattern BRP2 through an eighth contact hole CH8 passing through the protective layer PSV.

The third anode electrode AD3 may be disposed in the second region II of each pixel PXL, and be connected to the third bridge pattern BRP3 through an eighth contact hole CH8 passing through the protective layer PSV.

When viewed on a plane, a corner portion of each of the first to third anode electrodes AD1, AD2, and AD3 may have a curved shape. For example, the corner portion of each of the first to third anode electrodes AD1, AD2, and AD3 may have a curvature of at least 20 μm. As the corner portion of each of the first to third anode electrodes AD1, AD2, and AD3 has a curved shape, reflection and diffraction of light incident from the outside at the corner portion of each of the first to third anode electrodes AD1, AD2, and AD3 can be reduced when the display device serves as a mirror.

Further, as the distance between the second and third anode electrodes AD2 and AD3 disposed in the second region II is decreased, the reflection and diffraction of the light incident from the outside can be minimized when the display device serves as the mirror. In an embodiment of the present disclosure, the distance between the second anode electrode AD2 and the third anode electrode AD3 may be approximately 4 μm.

Figure 15:
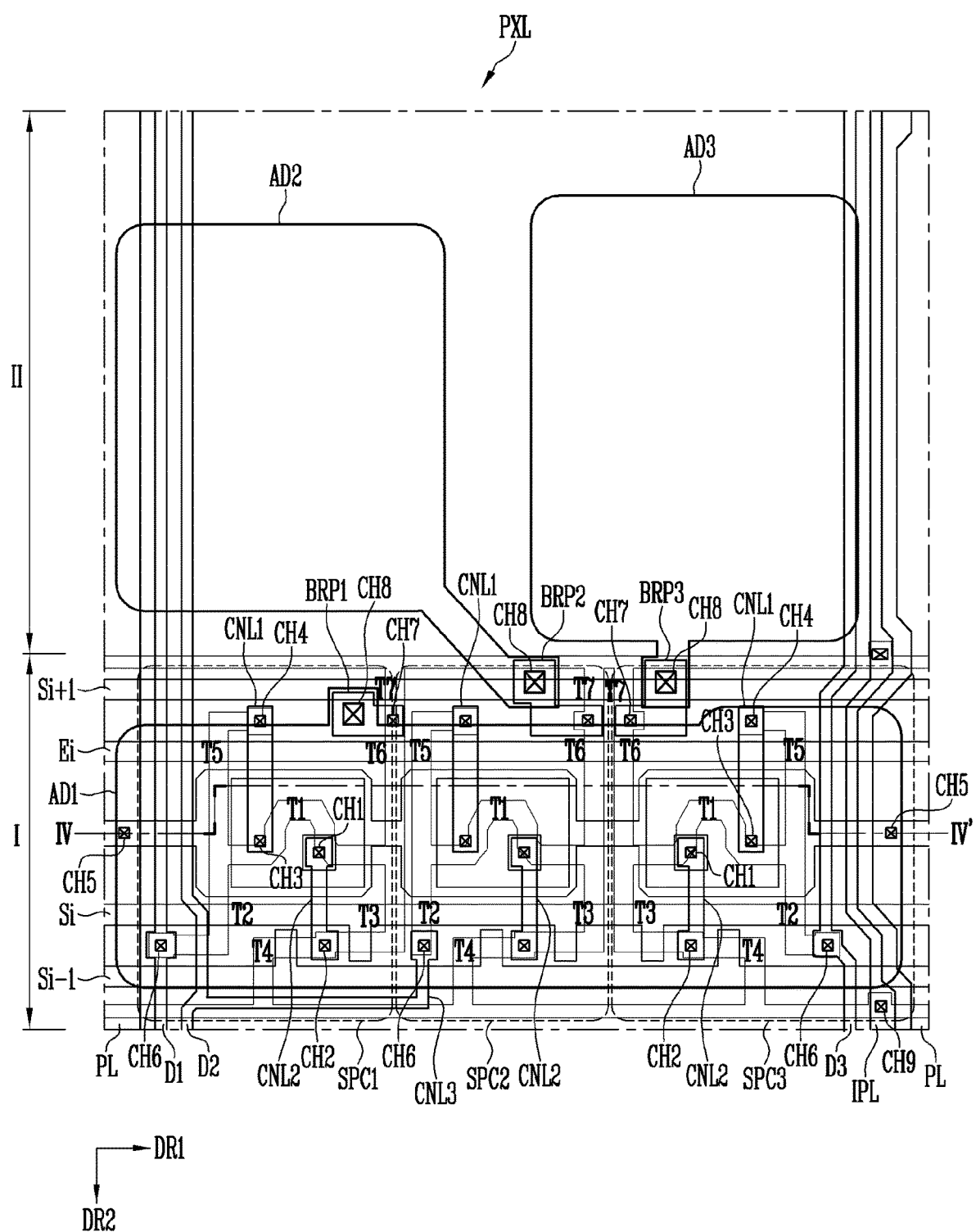
FIG. 15 is a plan view illustrating the pixel shown in FIG. 3 according to another embodiment of the present disclosure.
Figure 16:
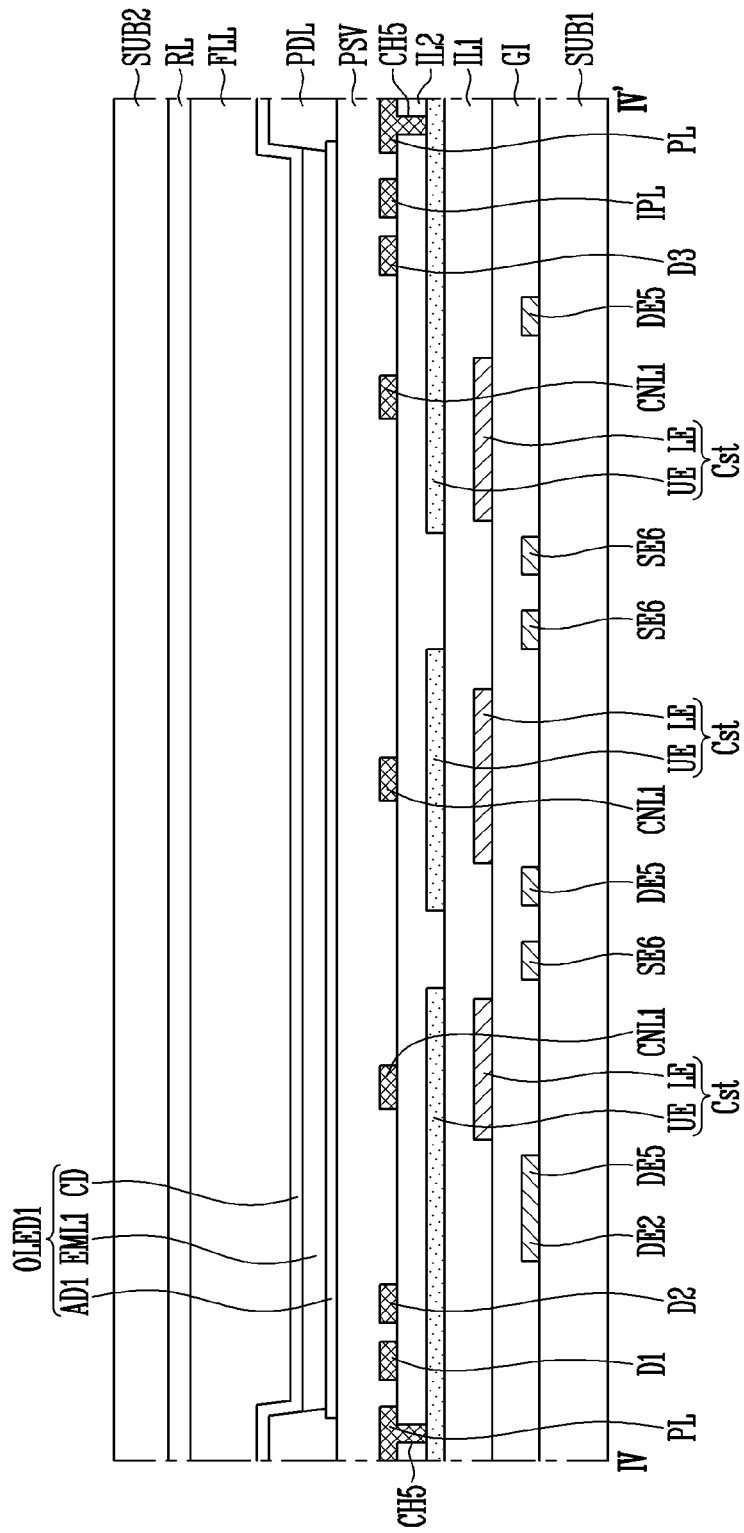
FIG. 16 is a sectional view taken along line IV-IV' of FIG. 15.

FIG. 15 is a plan view illustrating the pixel shown in FIG. 3 according to another embodiment of the present disclosure. FIG. 16 is a sectional view taken along line IV-IV' of FIG. 15. In a display device including the pixel implemented in the another embodiment of the present disclosure, differences from the display device according to the above-described embodiment will be mainly described to avoid redundancy. Portions not particularly described in the another embodiment of the present disclosure follow those of the above-described embodiment. Like reference numerals designate like components, and similar reference numerals designate similar components.

Referring to FIGS. 3, 15, and 16, the display device according to the embodiment of the present disclosure includes first and second substrates SUB1 and SUB2, a line unit, and pixels PXL.

The line unit provides signals to each pixel PXL, and includes scan lines Si−1, Si, and Si+1, first to third data lines D1, D2, and D3, a light emitting control line Ei, a power line PL, and an initialization power line IPL.

Each pixel PXL may include first to third sub-pixels.

The first sub-pixel may include may include a first sub-pixel circuit SPC1 and a first light emitting diode OLED1 connected to the first sub-pixel circuit SPC1. The second sub-pixel may include a second sub-pixel circuit SPC2 and a second light emitting diode (see the second light emitting diode OLED2 of FIG. 8) connected to the second sub-pixel circuit SPC2. The third sub-pixel may include a third sub-pixel circuit SPC3 and a third light emitting diode (see the third light emitting diode OLED3 of FIG. 8) connected to the third sub-pixel circuit SPC3. Here, each of the first to third sub-pixel circuits SPC1 to SPC3 may include first to seventh transistors T1 to T7 and a storage capacitor Cst.

The first sub-pixel may include a first light emitting region R that emits red light, the second sub-pixel may include a second light emitting region G that emits green light, and the third sub-pixel may include a third light emitting region B that emits blue light. Here, the first light emitting diode OLED1 may include a first anode electrode AD1 corresponding to the first light emitting region R, the second light emitting diode OLED2 may include a second anode electrode AD2 corresponding to the second light emitting region G, and the third light emitting diode OLED3 may include a third anode electrode AD3 corresponding to the third light emitting region B.

In an embodiment of the present disclosure, each of the pixels PXL may include a first region I and a second region II. The first to third sub-pixel circuits SPC1 to SPC3 and the first anode electrode AD1 may be disposed in the first region I, and the second and third anode electrodes AD2 and AD3 may be disposed in the second region II. That is, the first to third sub-pixel circuits SPC1 to SPC3 are not disposed in the second region II.

When viewed on a plane, the first anode electrode AD1 may overlap with the first to third sub-pixel circuits SPC1 to SPC3 to cover the first to third sub-pixel circuits SPC1 to SPC3. Specifically, the first anode electrode AD1 may extend along a first direction DR1 in the first region I to cover the first to third sub-pixel circuits SPC1 to SPC3. In an embodiment of the present disclosure, it has been illustrated that, when viewed on a plane, the first anode electrode AD1 partially covers the first to third sub-pixel circuits SPC1 to SPC3, but the present disclosure is not limited thereto. For example, the first anode electrode AD1 may entirely cover the first to third sub-pixel circuits SPC1 to SPC3 within a range in which electrical insulation of the first anode electrode AD1 from the second and third anode electrodes AD2 and AD3 is ensured.

Since the first to third sub-pixel circuits SPC1 to SPC3 are not disposed in the second region II, the second region II may be a flat region that is not influenced by step differences generated by the first to third sub-pixel circuits SPC1, SPC2, and SPC3.

As described above, if only the second and third anode electrodes AD2 and AD3 except the first anode electrode AD1 are disposed in the second region II, effective areas of the second and third anode electrodes AD2 and AD3 can be further secured. In this case, an effective area of the second light emitting region G corresponding to the second anode electrode AD2 and an effective area of the third light emitting region B corresponding to the third anode electrode AD3 can also be secured.

Further, as the first to third sub-pixel circuits SPC1 to SPC3 are intensively disposed in a specific area of the pixel PXL, e.g., the first region I, an aperture ratio of the pixel can be secured, and accordingly, the light transmittance of the pixel PXL is increased, thereby improving image quality.

Again, a structure of the display device according to the embodiment of the present disclosure will be described along a stacking order with reference to FIGS. 15 and 16.

First, the active patterns ACT1 to ACT7 (hereinafter, referred to as the active patterns ACT) may be disposed on the first substrate SUB1. The active patterns ACT may include the first to seventh active patterns ACT1 to ACT7.

A gate insulating layer GI may be disposed on the active patterns ACT.

The scan lines Si−1, Si, and Si+1, the light emitting control line Ei, and first to seventh gate electrodes (see the first to seventh gate electrodes GE1 to GE7 of FIG. 5) may be disposed on the gate insulating layer GI. The first gate electrode GE1 may become a lower electrode LE of the storage capacitor Cst of each of the first to third sub-pixel circuits SPC1 to SPC3.

A first insulating layer IL1 may be disposed on the first substrate SUB1 on which the scan lines Si−1, Si, and Si+1 and the like are formed.

An upper electrode UE of the storage capacitor Cst may be disposed on the first insulating layer IL1. The upper electrode UE may cover the lower electrode LE. The upper electrode UE along with the lower electrode LE may constitute the storage capacitor Cst with the first insulating layer IL1 interposed therebetween.

A second insulating layer IL2 may be disposed on the first substrate SUB1 on which the upper electrode UE is formed.

The first to third data lines D1, D2, and D3, the power line PL, first to third contact lines CNL1, CNL2, and CNL3, the initialization power line IPL, and first to third bridge patterns BRP1, BRP2, and BRP3 may be disposed on the second insulating layer IL2.

A protective layer PSV may be disposed on the first substrate SUB1 on which the first to third data lines D1, D2, and D3 and the like are formed. The protective layer PSV may include any one of an organic insulating material and an inorganic insulating material. For example, in an embodiment of the present disclosure, the protective layer PSV may include an organic insulating material including an organic material. Particularly, the protective layer PSV may include an organic insulating material capable of reducing and planarizing surfaces of the second insulating layer IL2, which are curved due to step differences between components disposed thereunder, e.g., the first to seventh transistors T1 to T7. The organic material may include a polyacryl-based compound, a polyimide-based compound, a fluorine-based compound such as Teflon, a benzocyclobutene-based compound, and the like.

The first to third light emitting diodes OLED1, OLED2, and OLED3 respectively connected to the first to third sub-pixel circuits SPC1, SPC2, and SPC3 may be disposed on the protective layer PSV.

The first light emitting diode OLED1 may include the first anode electrode AD1, a cathode electrode CD, and a first emitting layer (see the first emitting layer EML1 of FIG. 8) disposed between the first anode electrode AD1 and the cathode electrode CD. The first anode electrode AD1 may be connected to the first bridge pattern BRP1 through an eighth contact hole CH8 passing through the protective layer PSV.

The second light emitting diode OLED2 includes the second anode electrode AD2, the cathode electrode CD, and a second emitting layer (see the second emitting layer EML2 of FIG. 8) disposed between the second anode electrode AD2 and the cathode electrode CD. The second anode electrode AD2 may be connected to the second bridge pattern BRP2 through an eighth contact hole CH8 passing through the protective layer PSV.

The third light emitting diode OLED3 includes the third anode electrode AD3, the cathode electrode CD, and a third emitting layer (see the third emitting layer EML3 of FIG. 8) disposed between the third anode electrode AD3 and the cathode electrode CD. The third anode electrode AD3 may be connected to the third bridge pattern BRP3 through an eighth contact hole CH8 passing through the protective layer PSV.

A pixel defining layer PDL defining the first to third light emitting regions R, G, and B may be disposed on the first substrate SUB1 on which the first to third anode electrodes AD1, AD2, and AD3 and the like are disposed. The pixel defining layer PDL may expose a top surface of each of the first to third anode electrodes AD1, AD2, and AD3, and protrude from the first substrate SUB1 along the circumference of the first to third light emitting regions R, G, and B.

The first to third light emitting layers EML1, EML2, and the EML3 may be disposed in the first to third light emitting regions R, G, and B surrounded by the pixel defining layer PDL, respectively. The cathode electrode CD may be disposed on the first to third emitting layers EML1, EML2, and EML3.

A filling layer FLL covering the cathode electrode CD may be disposed on the cathode electrode CD.

The second substrate SUB may be disposed on the filling layer FLL. The second substrate SUB2 may be an encapsulation substrate for preventing oxygen and moisture from penetrating into the first to third light emitting diodes OLED1 to OLED3.

A reflective member RL may be disposed between the filling layer FLL and the second substrate SUB2. The reflective member RL reflects light incident from the outside in a mode in which the display device does not display any image, so that the display device can serve as a mirror.

The reflective member RL may be disposed under the second substrate SUB2 to cover both of the first and second regions I and II of each pixel PXL.

At this time, the first to third sub-pixel circuits SPC1, SPC2, and SPC3 are not disposed in the second regions II, but only the second and third anode electrodes AD2 and AD3 are disposed on the second region II. Since the first to third sub-pixel circuits SPC1, SPC2, and SPC3 are not disposed in the second region II, the second region II may be a flat region that is not influenced by step differences generated by the first to third sub-pixel circuits SPC1, SPC2, and SPC3.

The reflective member RL disposed at an upper portion of the second region II as the flat region may have specular reflection characteristics that light is clearly reflected like a mirror when the display device serves as the mirror.

Thus, in the display device according to the above-described embodiment, light incident from the outside does not cause diffused reflection in the second region II but is constantly reflected, thereby serving as a clear mirror.

As described above, the first anode electrode AD1 may be provided in the first region I in a shape covering all of the first to third sub-pixel circuits SPC1 to SPC3. Therefore, an area of the first anode electrode AD1 disposed in the first region I may be substantially similar to that of the second and third anode electrodes AD2 and AD3 disposed in the second region II. That is, the areas of the anode electrodes respectively provided in the first and second regions I and II area are maintained to an equal level, so that uniformities of the first and second regions I and II can be similar to each other. Accordingly, it is possible to reduce the reflection and diffraction of external light generated due to a difference in uniformity between the first and second regions I and II when the display device serves as a mirror. Thus, the display device can implement a clear image.

If light incident from the outside when the display device serves as the mirror advances toward the first to third sub-pixel circuits SPC1 to SPC3 by passing through the reflective member RL, the light may cause diffused reflection due to step differences between the first to third sub-pixel circuits SPC1 to SPC3. In addition, when light diffused-reflected from the first to third sub-pixel circuits SPC1 to SPC3 re-passes through the reflective member RL, organic insulating materials provided in the first to third sub-pixel circuits SPC1 to SPC3, e.g., colors of the protective layer PSV and the pixel defining layer PDL may be viewed.

In order to prevent this, in an embodiment of the present disclosure, the first anode electrode AD1 may be disposed to cover all of the first to third sub-pixel circuits SPC1 to SPC3.

Specifically, although light incident from the outside passes through the reflective member RL, it is possible to block the light from advancing up to the first to third sub-pixel circuits SPC1 to SPC3 because the first anode electrode AD1 covers all of the first to third sub-pixel circuits SPC1 to SPC3. Accordingly, it is possible to prevent a phenomenon that the light incident from the outside is diffused-reflected due to the step differences between the first to third sub-pixel circuits SPC1 to SPC3, thereby improving reflection efficiency.

Further, the first anode electrode AD1 can block the light incident from the outside from re-passing through the reflective member RL even when the light partially advances toward the first to third sub-pixel circuits SPC1 to SPC3 by passing through the reflective member RL. Accordingly, it is possible to prevent a phenomenon that colors of the protective layer PSV and the pixel defining layer PDL, which are provided in the first to third sub-pixel circuits SPC1 to SPC3, are viewed to the outside.

Thus, the display device according to the embodiment of the present disclosure can have improved reflection efficiency to be implemented as a mirror capable of reflecting a clear image.

Figure 17:
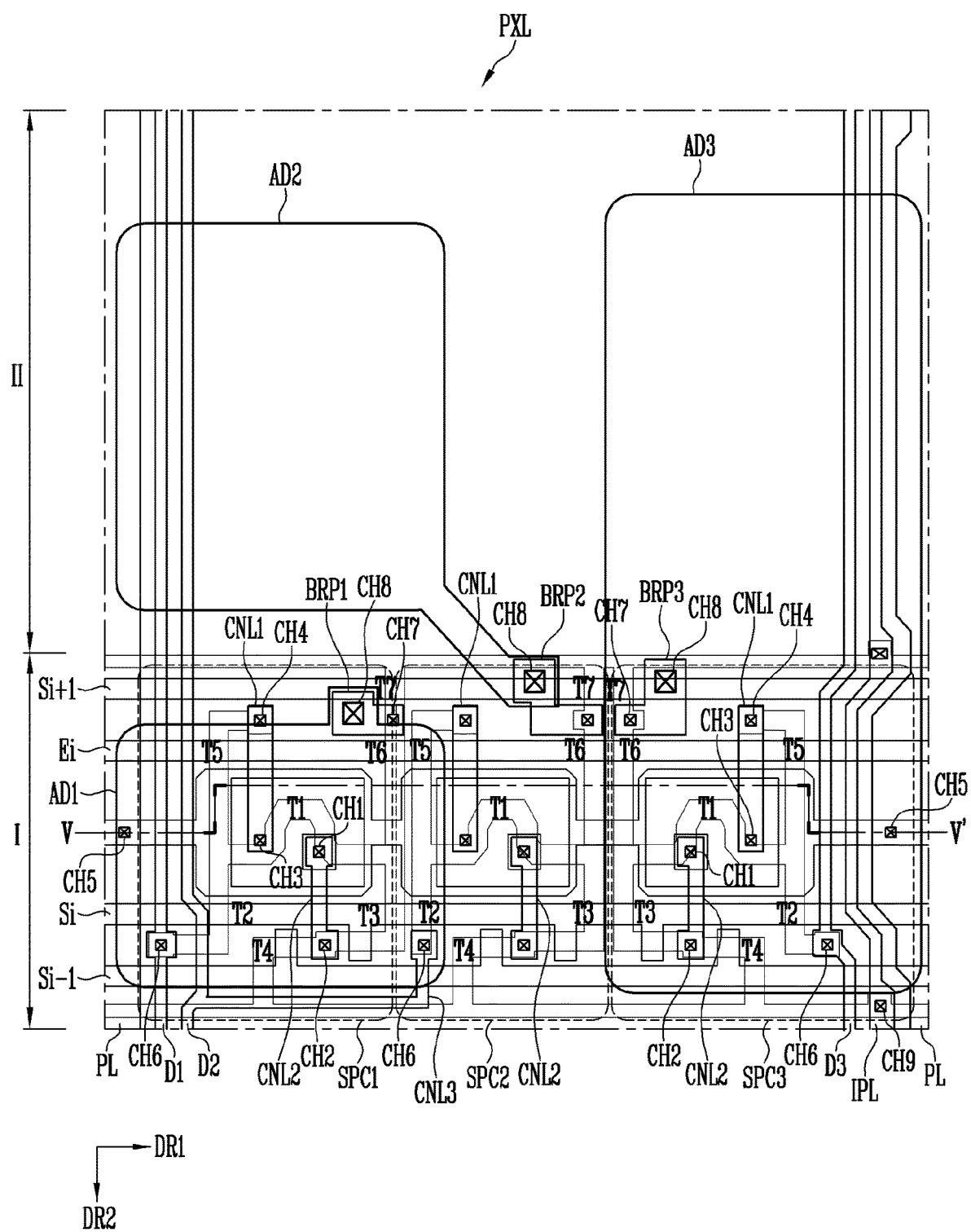
FIG. 17 is a plan view illustrating the pixel shown in FIG. 3 according to still another embodiment of the present disclosure.
Figure 18:
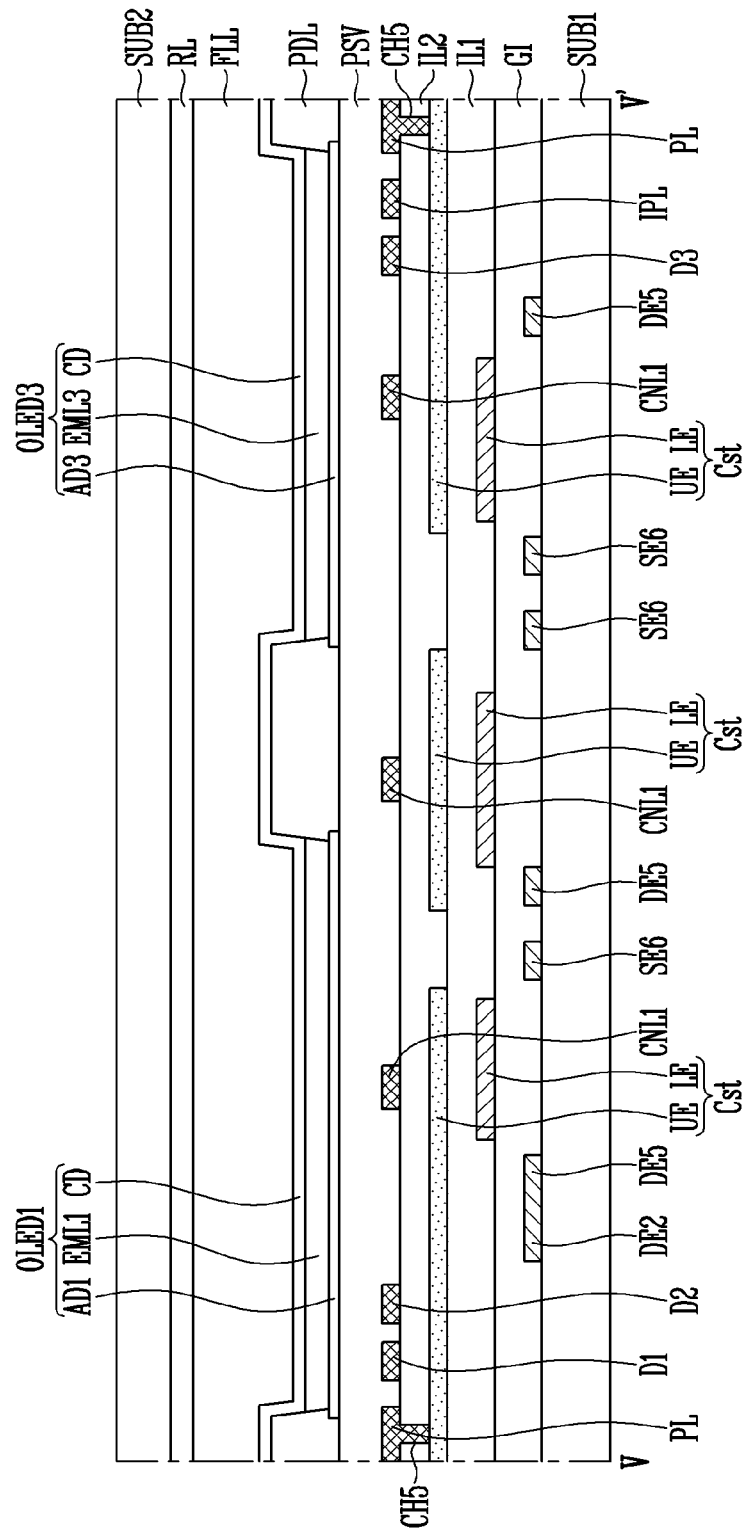
FIG. 18 is a sectional view taken along line V-V' of FIG. 17.

FIG. 17 is a plan view illustrating the pixel shown in FIG. 3 according to still another embodiment of the present disclosure. FIG. 18 is a sectional view taken along line V-V' of FIG. 17. In a display device including the pixel implemented in the still another embodiment of the present disclosure, differences from the display device according to the above-described embodiment will be mainly described to avoid redundancy. Portions not particularly described in the still another embodiment of the present disclosure follow those of the above-described embodiment. Like reference numerals designate like components, and similar reference numerals designate similar components.

Referring to FIGS. 3, 17, and 18, the display device according to the embodiment of the present disclosure includes first and second substrates SUB1 and SUB2, a line unit, and pixels PXL.

The line unit provides signals to each pixel PXL, and includes scan lines Si−1, Si, and Si+1, first to third data lines D1, D2, and D3, a light emitting control line Ei, a power line PL, and an initialization power line IPL.

Each pixel PXL may include first to third sub-pixels.

The first sub-pixel may include may include a first sub-pixel circuit SPC1 and a first light emitting diode OLED1 connected to the first sub-pixel circuit SPC1. The second sub-pixel may include a second sub-pixel circuit SPC2 and a second light emitting diode (see the second light emitting diode OLED2 of FIG. 8) connected to the second sub-pixel circuit SPC2. The third sub-pixel may include a third sub-pixel circuit SPC3 and a third light emitting diode (see the third light emitting diode OLED3 of FIG. 8) connected to the third sub-pixel circuit SPC3. Here, each of the first to third sub-pixel circuits SPC1 to SPC3 may include first to seventh transistors T1 to T7 and a storage capacitor Cst.

The first sub-pixel may include a first light emitting region R that emits red light, the second sub-pixel may include a second light emitting region G that emits green light, and the third sub-pixel may include a third light emitting region B that emits blue light. Here, the first light emitting diode OLED1 may include a first anode electrode AD1 corresponding to the first light emitting region R, the second light emitting diode OLED2 may include a second anode electrode AD2 corresponding to the second light emitting region G, and the third light emitting diode OLED3 may include a third anode electrode AD3 corresponding to the third light emitting region B.

In an embodiment of the present disclosure, each of the pixels PXL may include a first region I and a second region II. The first to third sub-pixel circuits SPC1 to SPC3, the first anode electrode AD1, and a portion of the third anode electrode AD3 may be disposed in the first region I, and the second anode electrode AD2 and the remaining portion of the third anode electrode AD3 may be disposed in the second region II. That is, the first to third sub-pixel circuits SPC1 to SPC3 are not disposed in the second region II.

When viewed on a plane, the first anode electrode AD1 may overlap with the first sub-pixel circuit SPC1 to cover the first sub-pixel circuit SPC1. Also, when viewed on a plane, the first anode electrode AD1 may partially overlap with the second sub-pixel circuit SPC2 to cover a portion of the second sub-pixel circuit SPC2. The first anode electrode AD1 partially overlapping with the second sub-pixel circuit SPC2 may be provided in various shapes within a limit in which the first anode electrode AD1 does not generate a parasitic capacitance with the second sub-pixel circuit SPC2.

When viewed on a plane, the third anode electrode AD3 may extend along a second direction DR2 from the second region II to the first region I. Therefore, a portion of the third anode electrode AD3 may be disposed in the first region I, and the remaining portion of the third anode electrode AD3 may be disposed in the second region II.

When viewed on a plane, the portion of the third anode electrode AD3, which is disposed in the first region I, may overlap with the third sub-pixel circuit SPC3 to cover the third sub-pixel circuit SPC3.

Also, when viewed on a plane, the portion of the third anode electrode AD3, which is disposed in the first region I, may partially overlap with the second sub-pixel circuit SPC2 to cover a portion of the second sub-pixel circuit SPC2. Particularly, a parasitic capacitance may be generated due to coupling of the portion of the third anode electrode AD3, which is disposed in the first region I, with a first node (see the first node N1 of FIG. 4) provided in the second sub-pixel circuit SPC2. Therefore, the portion of the third anode electrode AD3, which is disposed in the first region I, may be implemented in a shape that does not overlapping with the first node N1. For example, the portion of the third anode electrode AD3, which is disposed in the first region I, may be implemented in a shape that does not overlap with a first transistor T1 and third and fourth transistors T3 and T4, which are connected to the first node N1 of the second sub-pixel circuit SPC2. The portion of the third anode electrode AD3, which is disposed in the first region I, may be provided in various shapes within a limit in which the portion of the third anode electrode AD3, which is disposed in the first region I, does not generate a parasitic capacitance with the second sub-pixel circuit SPC2.

Since the first to third sub-pixel circuits SPC1, SPC2, and SPC3 are not disposed in the second region II, the second region II may be a flat region that is not influenced by step differences generated by the first to third sub-pixel circuits SPC1, SPC2, and SPC3.

As the first to third sub-pixel circuits SPC1 to SPC3 are intensively disposed in a specific region of the pixel PXL, e.g., in the first region I, an aperture ratio of the pixel can be secured, and accordingly, the light transmittance of the pixel PXL is increased, thereby improving image quality.

Again, a structure of the display device according to the embodiment of the present disclosure will be described along a stacking order with reference to FIGS. 17 and 18.

First, active patterns ACT1 to ACT7 (hereinafter, referred to as the active patterns ACT) may be disposed on the first substrate SUB1. The active patterns ACT may include first to seventh active patterns ACT1 to ACT7.

A gate insulating layer GI may be disposed on the active patterns ACT.

The scan lines Si−1, Si, and Si+1, the light emitting control line Ei, and first to seventh gate electrodes (see the first to seventh gate electrodes GE1 to GE7 of FIG. 5) may be disposed on the gate insulating layer GI. The first gate electrode GE1 may become a lower electrode LE of the storage capacitor Cst of each of the first to third sub-pixel circuits SPC1 to SPC3.

A first insulating layer IL1 may be disposed on the first substrate SUB1 on which the scan lines Si−1, Si, and Si+1 and the like are formed.

An upper electrode UE of the storage capacitor Cst may be disposed on the first insulating layer IL1. The upper electrode UE may cover the lower electrode LE. The upper electrode UE along with the lower electrode LE may constitute the storage capacitor Cst with the first insulating layer IL1 interposed therebetween.

A second insulating layer IL2 may be disposed on the first substrate SUB1 on which the upper electrode UE is formed.

The first to third data lines D1, D2, and D3, the power line PL, first to third contact lines CNL1, CNL2, and CNL3, the initialization power line IPL, and first to third bridge patterns BRP1, BRP2, and BRP3 may be disposed on the second insulating layer IL2.

A protective layer PSV may be disposed on the first substrate SUB1 on which the first to third data lines D1, D2, and D3 and the like are formed. The protective layer PSV may include an organic insulating material including an organic material.

The first to third light emitting diodes OLED1, OLED2, and OLED3 respectively connected to the first to third sub-pixel circuits SPC1, SPC2, and SPC3 may be disposed on the protective layer PSV.

The first light emitting diode OLED1 may include the first anode electrode AD1, a cathode electrode CD, and a first emitting layer EML1 disposed between the first anode electrode AD1 and the cathode electrode CD. The first anode electrode AD1 may be connected to the first bridge pattern BRP1 through an eighth contact hole CH8 passing through the protective layer PSV.

The second light emitting diode OLED2 includes the second anode electrode AD2, the cathode electrode CD, and a second emitting layer (see the second emitting layer EML2 of FIG. 8) disposed between the second anode electrode AD2 and the cathode electrode CD.

The third light emitting diode OLED3 includes the third anode electrode AD3, the cathode electrode CD, and a third emitting layer EML3 disposed between the third anode electrode AD3 and the cathode electrode CD.

A pixel defining layer PDL defining the first to third light emitting regions R, G, and B may be disposed on the first substrate SUB1 on which the first to third anode electrodes AD1, AD2, and AD3 and the like are disposed.

The first to third light emitting layers EML1, EML2, and the EML3 may be disposed in the first to third light emitting regions R, G, and B surrounded by the pixel defining layer PDL, respectively. The cathode electrode CD may be disposed on the first to third emitting layers EML1, EML2, and EML3.

A filling layer FLL covering the cathode electrode CD may be disposed on the cathode electrode CD.

The second substrate SUB may be disposed on the filling layer FLL. The second substrate SUB2 may be an encapsulation substrate for preventing oxygen and moisture from penetrating into the first to third light emitting diodes OLED1 to OLED3.

A reflective member RL may be disposed between the filling layer FLL and the second substrate SUB2. The reflective member RL reflects light incident from the outside in a mode in which the display device does not display any image, so that the display device can serve as a mirror.

The display device according to the embodiment of the present disclosure can be employed in various electronic devices. For example, the display device is applicable to televisions, notebook computers, cellular phones, smart phones, smart pads (PDs), PMPs, PDAs, navigations, various wearable devices such as smart watches, and the like.

According to the present disclosure, the above-described display device can provide improved image quality.

Further, the above-described display device can serve as a clear mirror by improving reflection efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising:
a substrate including a pixel region and a peripheral region surrounding at least one side of the pixel region;
a pixel provided in the pixel region and including a first region and a second region, the pixel including first, second, and third sub-pixels each including a light emitting region that emits light of a specific color; and
an encapsulation member opposite to the substrate and covering the pixel,
wherein each of the first, second, and third sub-pixels comprises:
a pixel circuit disposed in the first region and including a plurality of transistors,
a first electrode connected to the pixel circuit,
an emitting layer disposed on the first electrode, and
a second electrode disposed on the emitting layer,
wherein the light emitting region of each of the first, second, and third sub-pixel is a region in which the first electrode, the emitting layer, and the second electrode overlap,
wherein the light emitting region of the first sub-pixel overlaps with the transistors included in the pixel circuit corresponding to the first sub-pixel, and
wherein the entire light emitting region of each of the second and third sub-pixels is spaced apart from all of the transistors included in the pixel circuit corresponding to the second sub-pixel and corresponding to the third sub-pixel, respectively, when viewed on a top view plane.

2. The display device of claim 1, wherein the first electrode disposed in the first sub pixel is not disposed in the second region.

3. The display device of claim 1, further comprising a filling layer disposed between the first electrode disposed in each of the first, second, and third sub-pixels and the encapsulation member.

4. The display device of claim 1, wherein the first electrode disposed in the first sub-pixel overlaps a portion of the pixel circuit disposed in the second sub-pixel.

5. The display device of claim 1, wherein the first electrode disposed in the first sub-pixel extends along a first direction of the substrate to overlap all of the pixel circuits disposed in each of first to third sub-pixels.

6. The display device of claim 5, wherein each of the first, second, and third sub-pixels includes:

a scan line extending in the first direction of the substrate and supplying a scan signal to the corresponding sub-pixel;

a data line extending in a second direction and supplying a data signal to the corresponding sub-pixel; and a driving voltage line extending in the second direction and supplying a driving voltage.

7. The display device of claim 1, wherein the first electrode disposed in the second sub-pixel and the first electrode disposed in the third sub-pixel are disposed in the second region.

8. The display device of claim 1, wherein a corner portion of the first electrode of each of the first, second, and third sub-pixels has a curved shape.

9. The display device of claim 8, wherein the corner portion of the first electrode of each of the first, second, and third sub-pixels has a curvature of at least 20 μm.

10. The display device of claim 1, further comprising a reflective member disposed on one surface of the encapsulation member.

11. The display device of claim 10, wherein the reflective member is disposed on the encapsulation member to correspond to both of the first and second regions.

12. The display device of claim 11, wherein the reflective member has specular reflection characteristics.

13. The display device of claim 12, wherein the reflective member includes a metallic material having a constant reflexibility.

14. The display device of claim 1, further comprising an organic insulating layer disposed between the pixel circuit disposed in each of the first, second, and third sub-pixels and the first electrode disposed in the corresponding sub-pixel.

15. The display device of claim 14, wherein the organic insulating layer includes:

a protective layer disposed between the pixel circuit disposed in each of the first, second, and third sub-pixels and the first electrode disposed in the corresponding sub-pixel; and a pixel defining layer disposed on the protective layer.

16. The display device of claim 15, wherein the pixel defining layer has a black color.

* * * * *